(12) United States Patent
Vigraham et al.

(10) Patent No.: US 9,178,551 B2
(45) Date of Patent: Nov. 3, 2015

(54) CIRCUITS AND METHODS FOR PULSE RADIO RECEIVERS

(71) Applicants: Baradwaj Vigraham, New York, NY (US); Peter R Kinget, Summit, NJ (US)

(72) Inventors: Baradwaj Vigraham, New York, NY (US); Peter R Kinget, Summit, NJ (US)

(73) Assignee: The Trustees of Columbia University in the City of New York, New York, NY (US)

( * ) Notice: Subject to any disclaimer, the term of this patent is extended or adjusted under 35 U.S.C. 154(b) by 0 days.

(21) Appl. No.: 14/458,184

(22) Filed: Aug. 12, 2014

(65) Prior Publication Data

US 2015/0043616 A1    Feb. 12, 2015

Related U.S. Application Data

(60) Provisional application No. 61/865,112, filed on Aug. 12, 2013.

(51) Int. Cl.
| | |
|---|---|
| *H04L 27/06* | (2006.01) |
| *H03L 7/06* | (2006.01) |
| *H04B 1/16* | (2006.01) |
| *H04L 27/22* | (2006.01) |
| *H04B 1/69* | (2011.01) |

(52) U.S. Cl.
CPC .. *H04B 1/16* (2013.01); *H04B 1/69* (2013.01); *H04L 27/22* (2013.01)

(58) Field of Classification Search
USPC ........... 375/340, 373, 376; 327/147, 156, 157
See application file for complete search history.

(56) References Cited

U.S. PATENT DOCUMENTS

| | | | |
|---|---|---|---|
| 6,781,530 B2 | 8/2004 | Moore | |
| 7,190,722 B2 | 3/2007 | Lakkis et al. | |
| 2001/0041548 A1 | 11/2001 | Bult et al. | |
| 2004/0218687 A1 | 11/2004 | Santhoff | |
| 2005/0100102 A1 | 5/2005 | Gazdzinski et al. | |
| 2005/0213635 A1 | 9/2005 | Terada et al. | |
| 2006/0018369 A1 | 1/2006 | Sanada et al. | |
| 2006/0071718 A1 | 4/2006 | McCorquodale et al. | |
| 2006/0098713 A1 | 5/2006 | Tian | |
| 2006/0198474 A1 | 9/2006 | Sorrells et al. | |
| 2008/0056419 A1 | 3/2008 | Lee et al. | |

(Continued)

OTHER PUBLICATIONS

Balankutty, A., et al., "A 0.6-V Zero-If/Low-IF Receiver with Integrated Fractional-n. Synthesizer for 2.4-GHz ISM-Band Applications", In IEEE Journal of Solid-State Circuits, vol. 45, No. 3, Mar. 2010, pp. 538-553.

(Continued)

*Primary Examiner* — Khai Tran
(74) *Attorney, Agent, or Firm* — Byrne Poh LLP

(57) ABSTRACT

Circuits and methods comprising: a radio frequency amplifier that powers off in response to an enable signal; a demodulator that outputs an RZ signal; an all-digital clock and data recovery circuit comprising: a phase detector that includes a tri-state phase frequency detector for use when in an acquisition mode and a Hogge phase detector for use when in a communication mode, that receives the RZ signal, and that outputs a phase detector output from the tri-state phase frequency detector when in the acquisition mode and from the Hogge phase detector when in the communication mode, a loop filter that receives the phase detector output from the phase detector and produces a loop filter output that is the sum of a proportional path of the loop filter and an integral path of the loop filter, and a numerical controlled oscillator that receives the loop filter output and produces the enable signal.

16 Claims, 20 Drawing Sheets

(56) References Cited

U.S. PATENT DOCUMENTS

| | | |
|---|---|---|
| 2008/0069183 A1 | 3/2008 | Terada |
| 2011/0150044 A1 | 6/2011 | Berekovic et al. |
| 2012/0063556 A1* | 3/2012 | Hoang .......................... 375/371 |
| 2013/0195159 A1* | 8/2013 | Morohashi .................... 375/222 |

OTHER PUBLICATIONS

Cook, B.W., et al., "An Ultra-Low Power 2.4 GHz RF Transceiver for Wireless Sensor Networks in 0.13 µm CMOS with 400mV Supply and an Integrated Passive RX Front-End", In Proceedings of the IEEE International Solid-State Circuits Conference (ISSCC '06), San Francisco, CA, US, Feb. 6-9, 2006, pp. 1-3.

Crepaldi, M., et al., "An Ultra-Low Power Interference Robust IR-UWB Transceiver Chipset Using Self-Synchronizing OOK Modulation", In Proceedings of the International Solid-State Circuits Conference (ISSCC '10), San Francisco, CA, US, Feb. 7-11, 2010, pp. 226-227.

Crepaldi, M., et al., "An Ultra-Wideband Impulse-Radio Transceiver Chipset Using Synchronized-OOK Modulation", In IEEE Journal of Solid-State Circuits, vol. 46, No. 10, Aug. 11, 2011, pp. 2284-2299.

Daly, D.C. and Chandrakasan, A.P., "An Energy-Efficient OOK Transceiver for Wireless Sensor Networks", In IEEE Journal of Solid-State Circuits, vol. 42, No. 5, May 2007, pp. 1003-1011.

Daly, D.C. et al., "A Pulsed UWB Receiver SoC for Insect Motion Control," In Proceedings of the IEEE Solid State Circuits Conference (ISSCC '09), vol. 45, No. 1, Feb. 8-12, 2009, San Francisco, CA, US, pp. 153-166.

Darabi, H., et al., "A 2.4-GHz CMOS 563 Transceiver for Bluetooth", In IEEE Journal of Solid-State Circuits, vol. 36, No. 12, Dec. 2001, pp. 2016-2024.

Diao, S., et al., "A CMOS Ultra Low-Power and Highly Efficient UWB-IR Transmitter for WPAN Applications", In IEEE Transaction on Circuits and Systems—Part II: Express Briefs, vol. 56, No. 3, Mar. 2009, pp. 200-204.

Dokania, R.K., "A Low Power Impulse Radio Design for Body-Area-Networks", In IEEE Transactions on Circuits Syst. I: Regular Papers, vol. 58, No. 7, Apr. 25, 2011, pp. 1458-1469.

Dong, Y., et al., "A 9mW High Band FM-UWB Receiver Front-End", In Proceedings of the European Solid-State Circuits Conference, Edinburgh, GB, Sep. 15-19, 2008, pp. 302-305.

Drago, S., et al., "A 2.4 GHz 830pJ/bit Duty-Cycled Wake-Up Receiver with -82dBm Sensitivity for Crystal-Less Wireless Sensor Nodes", In Proceedings of the IEEE International Solid-State Circuits Conference (ISSCC '10), San Francisco, CA, US, Feb. 7-11, 2010, pp. 224-225.

Federal Communications Commission, "First Report and Order," FCC 02-48, Feb. 2002, pp. 1-118, available at: https://transition.fcc.gov/Bureaus/Engineering_Technology/Orders/2002/fcc02048.pdf.

Fernandes, J.R. and Wentzloff, D., "Recent Advances in IR-UWB Transceivers: An Overview", In Proceedings of the IEEE International Symposium on Circuits and Systems, Paris, FR, May 30-Jun. 2, 2010, pp. 3284-3287.

Foerster, J.R., et al., "A Channel Model for Ultra Wideband Indoor Communication", Technical Report, TR-2004-074, Mitsubishi Electric Research Laboratory, Inc, Oct. 2003, pp. 1-7.

Gambini, S., et al., "A Fully Integrated, 290 pJ/bit UWB Dual-Mode Transceiver for cm-Range Wireless Interconnects", In IEEE Journal of Solid-State Circuits, vol. 47, No. 3, Jan. 3, 2012, pp. 586-598.

Gerrits, J.F., et al., "FM-UWB: A Low-Complexity Constant Envelope LDR UWB Approach", In the 13th IEEE International Conference on Electronics, Circuits and Systems (ICECS'06), Nice, FR, Dec. 10-13, 2006, pp. 797-801.

Ghassemzadeh, S. and Tarokh, V., "The Ultra-wideband Indoor Path Loss Model", In IEEE P802.15 Working Group for Wireless Personal Area Networks (WPANs), Technical Report, Jul. 4, 2002, pp. 1-19.

Gorlatova, M., et al., "Energy Harvesting Active Networked Tags (EnHANTs) for Ubiquitous Object Networking", In IEEE Wireless Communications, vol. 17, No. 6, Dec. 2010, pp. 18-25.

Gupta, B., et al., "FM-UWB for Radar and Communications in Medical Applications", In the First International Symposium on Applied Sciences on Biomedical and Communication Technologies (ISABEL '08), Aalborg, DK, Oct. 25-28, 2008, pp. 1-5.

Hu, C., et al., "A 90 nm-CMOS, 500 Mbps, 3-5 GHz Fully-Integrated IR-UWB Transceiver with Multipath Equalization using Pulse Injection-Locking for Receiver Phase Synchronization", In IEEE Journal of Solid-State Circuits, vol. 46, No. 5, Mar. 24, 2011, pp. 1076-1088.

International Patent Application No. PCT/US2010/050595, filed Sep. 28, 2010.

International Preliminary Report on Patentability dated Apr. 12, 2012 in International Patent Application No. PCT/US2010/050595.

International Search Report dated Nov. 24, 2010 in International Patent Application No. PCT/US2010/050595.

Kluge, W., et al., "A Fully Integrated 2.4-GHz IEEE 802.15. 4-compliant Transceiver for ZigBee Applications", In IEEE Journal of Solid-State Circuits, vol. 41, No. 12, Dec. 2006, pp. 2767-2775.

Lachartre, D., et al., "A 1.1nJ/b 802.15.4a-Compliant Fully Integrated UWB Transceiver in 0.13 µm CMOS", In Proceedings of the IEEE International Solid State Circuit Conference (ISSCC '09), Digest of Technical Papers, San Francisco, CA, US, Feb. 8-12, 2009, pp. 312-313.

Lee, F.S. and Chandrakasan, A.P., "A 2.5 nJ/bit 0.65 V Pulsed UWB Receiver in 90 nm CMOS", in IEEE Journal of Solid-State Circuits, vol. 42, No. 12, Dec. 2007, pp. 2851-2859.

Luecken, H., et al., "Synchronization scheme for low duty cycle UWB impulse radio receiver", In IEEE International Symposium on Wireless Communication Systems, Reykjavik, IS, Oct. 21-24, 2008, pp. 503-507.

Molnar, A., et al., "An Ultra-Low Power 900 MHz RF Transceiver for Wireless Sensor Networks", In Proceedings of the IEEE Custom Integrated Circuits Conference, Orlando, FL, US, Oct. 3-6, 2004, pp. 401-404.

Nejad, M.B., "Ultra Wideband Impulse Radio for Wireless Sensing and Identification", Doctoral Thesis, KTH—Royal Institute of Technology, Dec. 2008, pp. 1-72.

Norimatsu, T., et al., "A UWB-IR Transmitter with Digitally Controlled Pulse Generator", In IEEE Journal of Solid-State Circuits, vol. 42, No. 6, Jun. 2007, pp. 1300-1309.

Office Action dated Apr. 24, 2013 in U.S. Appl. No. 13/498,801.

Otis, B., et al., "A 400 µW-Rx, 1.6 mW-TX Super-Regenerative Transceiver for Wireless Sensor Networks", In Proceedings of the IEEE International Solid-State Circuits Conference (ISSCC '05), San Francisco, CA, US, Feb. 10, 2005, pp. 396-606.

Pletcher, N.M, et al., "A 52 µW Wake-Up Receiver With -72 dBm Sensitivity Using an Uncertain-IF Architecture", In IEEE Journal of Solid-State Circuits, vol. 44, No. 1, Jan. 2009, pp. 269-280.

Smaini, L., et al., "Single-Chip CMOS Pulse Generator for UWB Systems", In IEEE Journal of Solid-State Circuits, vol. 41, No. 7, Jul. 2006, pp. 1551-1561.

Solda, S., et al., "A 5 Mb/s UWB-IR Transceiver Front-End for Wireless Sensor Networks in 0.13 µm CMOS", In IEEE Journal of Solid-State Circuits, vol. 46, No. 7, May 27, 2011, pp. 1636-1647.

Tamtrakarn, a., et al., "A 1-V 299 µW Flashing UWB Transceiver Based on Double Thresholding Scheme", In Proceedings of the IEEE Symposium on VLSI Circuits, Digest of Technical Papers, Honolulu, HI, US, Jun. 15-17, 2006, pp. 202-203.

Terada, T., et al., "A CMOS Ultra-Wideband Impulse Radio Transceiver for 1-Mb/s Data Communications and ±2.5-cm Range Finding", In IEEE Journal of Solid-State Circuits, vol. 41, No. 4, Apr. 2006, pp. 891-898.

Ugajin, M., et al., "Design Techniques for a 1-V Operation BLUETOOTH Rf Transceiver", In Proceedings of the IEEE Custom Integrated Circuits Conference, Orlando, FL, US, Oct. 3-6, 2004, pp. 393-400.

U.S. Appl. No. 13/498,801, filed Mar. 22, 2012.

U.S. Appl. No. 61/246,529, filed Sep. 28, 2009.

Van Helleputte, N., et al., "A Reconfigurable, 130 nm CMOS 108 pJ/pulse, Fully Integrated IR-UWB Receiver for Communication and Precise Ranging", In IEEE Journal of Solid-State Circuits, vol. 45, No. 1, Jan. 2010, pp. 69-83.

(56) References Cited

OTHER PUBLICATIONS

Verhelst, M., et al., "A Reconfigurable 0.13 μm CMOS 110pJ/pulse, Fully Integrated IR-UWB Receiver for Communication and Sub-cm Ranging", In Proceedings of the IEEE Int. Solid-State Circuits Conference (ISSCC '09), Digest of Technical Papers, San Francisco, CA, US, Feb. 8-12, 2009, pp. 250-251.

Vigraham, B. and Kinget, P., "A Self-Duty-Cycled and Synchronized UWB Pulse-Radio Receiver SoC With Automatic Threshold-Recovery Based Demodulation", In IEEE Journal of Solid State Circuits, vol. 49, No. 3, Mar. 2014, pp. 581-594.

Vigraham, B. and Kinget, P., "A Self-Duty-Cycled and Synchronized UWB Receiver SoC Consuming 375pJ/b for -76.5dBm Sensitivity at 2Mb/s", In Proceedings of the IEEE International Solid-State Circuits Conference (ISSCC '13), San Francisco, CA, US, Feb. 17-23, 2013, pp. 444-446.

Vigraham, B. and Kinget, P., "An Ultra Low Power, Compact UWB Receiver with Automatic Threshold Recovery in 65 nm CMOS", In Proceedings of the IEEE Radio Frequency Integrated Circuits Symposium, Montreal, QC, CA, Jun. 17-18, 2012, pp. 251-254.

Wang, X., et al., "A Crystal-Less Self-Synchronized Bit-Level Duty-Cycled IR-UWB Transceiver System", In IEEE Transactions on Circuits Syst. I, Apr. 9, 2013, pp. 2488-2501.

Wang, X., et al., "A Meter-Range UWB Transceiver Chipset for Around-the-Head Audio Streaming", In Proceedings of the IEEE International Solid-State Circuits Conference (ISSCC '12), San Francisco, CA, US, Feb. 19-23, 2012, pp. 450-452.

Wang, X.Y., et al., "A Self-Synchronized, Crystal-Less, 86 μW, Dual-Band Impulse Radio for Ad-Hoc Wireless Networks", In Proceedings of the IEEE Radio Frequency Integrated Circuits Symposium (RFIC '11), Baltimore, MD, US, Jun. 5-7, 2011, pp. 1-4.

Wentzloff, D.D. and Chandrakasan, A.P., "A 47 pJ/pulse 3.1-to-5 GHz All-Digital UWB Transmitter in 90nm CMOS", In Proceedings of the IEEE International Solid-State Circuits Conference (ISSCC '07), San Francisco, CA, US, Feb. 11-15, 2007, pp. 118-119.

Wentzloff. D. D. and Chandrakasan, A. P., "Gaussian Pulse Generators for Subbanded Ultra-Wideband Transmitters" In IEEE Transactions on Microwave Theory and Techniques, vol. 54, No. 4, Jun. 2006, pp. 1647-1655.

Win, M.Z., et al., "Ultra-Wide Bandwidth Signal Propagation for Indoor Wireless Communications", In Proceedings of the IEEE International Conference on Communications, vol. 1, Montreal, QC, CA, Jun. 8-12, 1997, pp. 56-60.

Wong, A., et al., "A 1V 5mA Multimode IEEE 802.15. 6/Bluetooth Low-Energy WBAN Transceiver for Biotelemetry Applications", In Proceedings of the IEEE International Solid-State Circuits Conference (ISSCC '12), San Francisco, CA, US, Feb. 19-23, 2012, pp. 300-302.

Wong, A.-W., et al., "A 1V, Micropower System-on-Chip for Vital-Sign Monitoring in Wireless Body Sensor Networks", In Proceedings of the IEEE International Solid-State Circuits Conference (ISSCC '08), San Fancisco, CA, US, Feb. 3-7, 2008, pp. 138-602.

Written Opinion dated Nov. 24, 2010 in International Patent Application No. PCT/US2010/050595.

Xia, L., et al., "0.15-nJ/b 3-5-GHz IR-UWB System with Spectrum Tunable Transmitter and Merged-Correlator Noncoherent Receiver", In IEEE Transactions on Microwave Theory and Techniques, vol. 59, No. 4, Mar. 10, 2011, pp. 1147-1156.

Zarifi, M. H. and Frounchi, J., "Design of an Input Matching Network for RF CMOS LNAs using Stack Inductors", In Proceedings of the International Conference on Computer and Communication Engineering (ICCCE '08), Kuala Lumpur, MY, May 13-15, 2008, pp. 672-676.

* cited by examiner

CIRCUITS AND METHODS FOR PULSE RADIO RECEIVERS

CROSS REFERENCE TO RELATED APPLICATION

This application claims the benefit of U.S. Provisional Patent Application No. 61/865,112, filed Aug. 12, 2013, which is hereby incorporated by reference herein in its entirety.

BACKGROUND

Pulse radio ultra wide band (PR-UWB) communications can be used to facilitate low power, low data rate communications in a wide variety of applications, such as sensor networks. Such communications use periodically transmitted pulses of radio frequency energy to represent data. Power savings in such communications can be realized by turning the transmitter and receiver off between data pulses. In order to take advantage of the power savings of such communications, however, pulse radio receivers need to be able to precisely power off during times when no data pulses are being transmitted and power on when data pulses may be transmitted. However, current pulse radio receivers are lacking in their ability to perform this function.

Accordingly, new circuits and methods for pulse radio receivers are provided.

SUMMARY

Circuits and methods for pulse radio receivers are provided. In some embodiments, circuits for a pulse radio receiver are provided, the circuits comprising: a radio frequency amplifier that powers off in response to an enable signal; a demodulator that outputs an RZ signal; an all-digital clock and data recovery circuit comprising: a phase detector that includes a tri-state phase frequency detector for use when in an acquisition mode and a Hogge phase detector for use when in a communication mode, that receives the RZ signal, and that outputs a phase detector output from the tri-state phase frequency detector when in the acquisition mode and from the Hogge phase detector when in the communication mode, a loop filter that receives the phase detector output from the phase detector and produces a loop filter output that is the sum of a proportional path of the loop filter and an integral path of the loop filter, and a numerical controlled oscillator that receives the loop filter output and produces the enable signal.

In some embodiments, methods of operating a pulse radio receiver are provided, the methods comprising: powering off a radio frequency amplifier in response to an enable signal; outputting an RZ signal from a demodulator; using an all-digital clock and data recovery circuit to: using a phase detector that includes a tri-state phase frequency detector for use when in an acquisition mode and a Hogge phase detector for use when in a communication mode to receive the RZ signal and output a phase detector output from the tri-state phase frequency detector when in the acquisition mode and from the Hogge phase detector when in the communication mode, using a loop filter to receive the phase detector output from the phase detector and produce a loop filter output that is the sum of a proportional path of the loop filter and an integral path of the loop filter, and using a numerical controlled oscillator to receive the loop filter output and produce the enable signal.

BRIEF DESCRIPTION OF THE DRAWINGS

Various objects, features, and advantages of the disclosed subject matter can be more fully appreciated with reference to the following detailed description of the disclosed subject matter when considered in connection with the following drawings, in which like reference numerals identify like elements.

DETAILED DESCRIPTION

Circuits and methods for pulse radio receivers are provided.

In some embodiments, a receiver can be provided that includes three stages of RF gain and filtering, a self-mixer, a programmable gain amplifier, a demodulator, and an all-digital clock and data recovery (AD-CDR) circuit. During operation, the receiver can generally operate as follows. After being amplified and filtered in the three stages, a received signal can then be down-converted using the self-mixer, amplified using the programmable gain amplifier, and fed into the demodulator. In the demodulator, a threshold voltage recovery loop can be used to slice the analog pulses to obtain an RZ digital representation of the received signal. Finally, the AD-CDR can be used to recover the clock from the RZ pulses and self-duty-cycle the receiver and perform demodulation.

Figure 1:
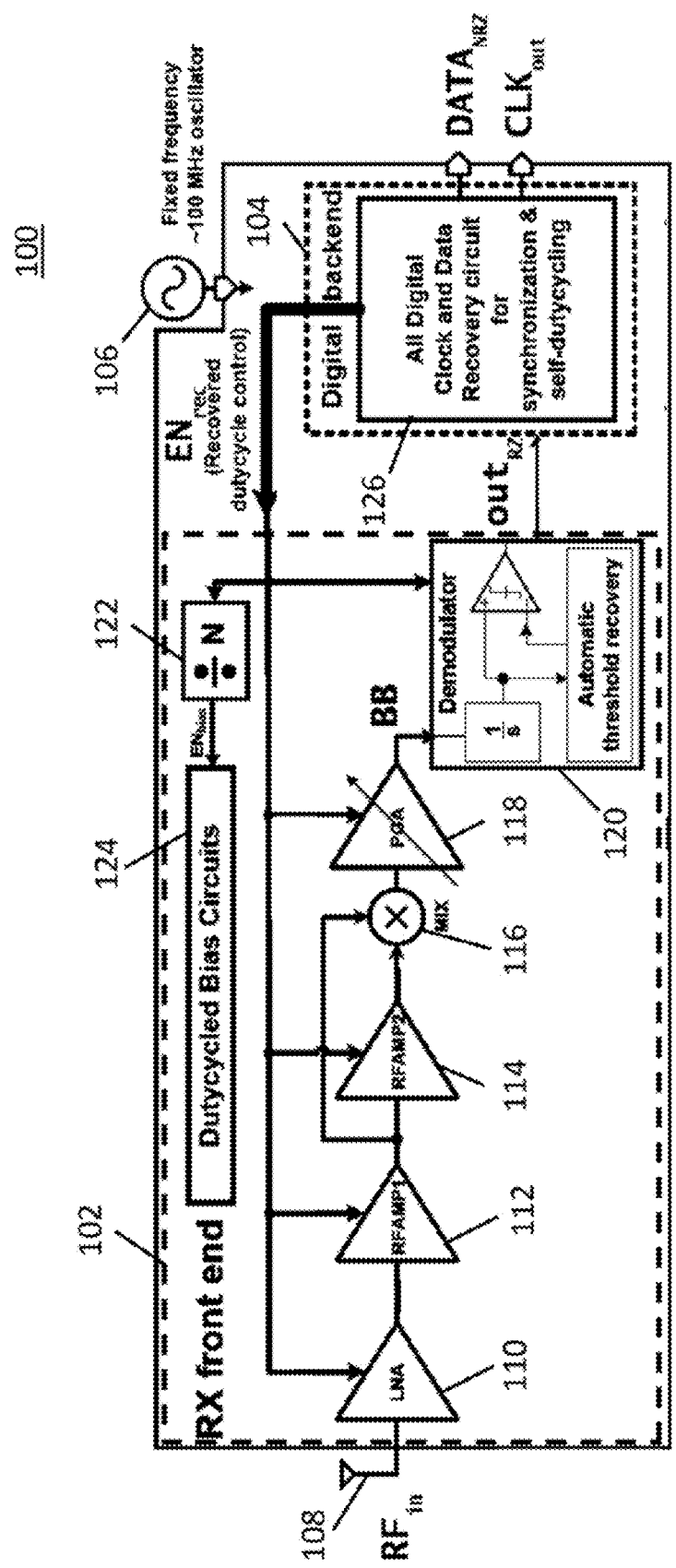
FIG. 1 is a block diagram of an example of a receiver in accordance with some embodiments.

Turning to FIG. 1, an example of a receiver 100 in accordance with some embodiments is shown. As illustrated receiver 100 can include a receiver front end 102 and a digital backend 104. The receiver can be coupled to an oscillator 106 and an antenna 108 in some embodiments.

As shown in FIG. 1, front end 102 can include a low noise amplifier (LNA) 110, a first radio frequency (RF) amplifier 112, a second RF amplifier 114, and self-mixer 116, a programmable gain amplifier 118, a demodulator 120, a divider 112, and duty-cycled bias circuits 124. Backend 104 can include an all-digital clock and data recovery circuit (AD-CDR) 126. Examples of circuits that can be used for these components of front end 102 and backend 104 are described below in connections with FIGS. 3-20.

Figure 2:
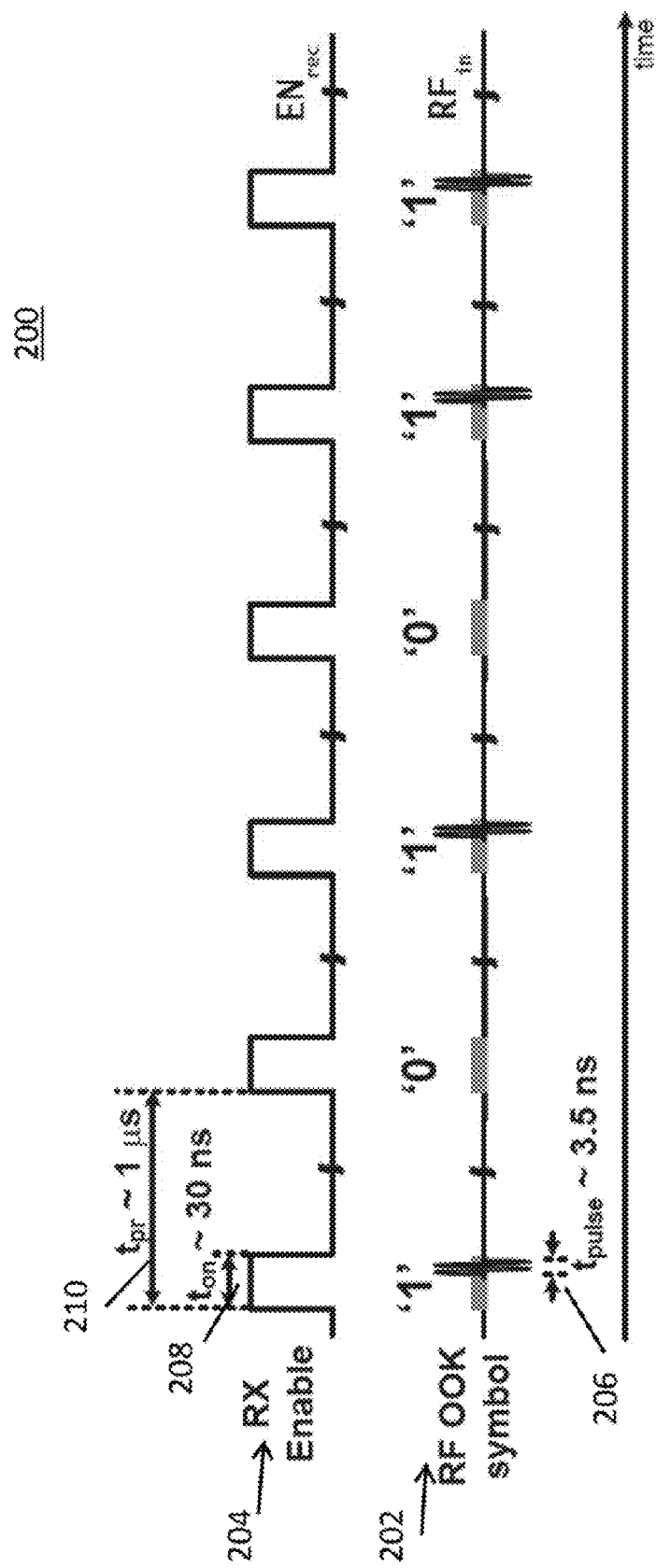
FIG. 2 is an illustration of an example of an On-Off Keying modulated signal that can be received using a receiver in accordance with some embodiments.

In accordance with some embodiment, On/Off Key (OOK) modulation can be used with receiver 100. Turning to FIG. 2, an illustration 200 of a series of RF OOK symbols 202 that can be received and a receiver enable signal (RX Enable) 204 that can be used in some embodiments is shown.

As illustrated in series of RF OOK symbols 202, the presence of an RF pulse at a given point in time can represent a '1' OOK symbol and the absence of an RF pulse at a given point in time can represent a '0' OOK symbol. In some embodiments, the RF pulses can have a width ($t_{pulse}$) of approximately 3.5 ns and a bandwidth of approximately 500 MHz, and can have a frequency centered in the lower ultra-wide band (UWB) band (3.6-5 GHz). Additionally or alternatively, any other suitable width(s), bandwidth(s), and/or frequency center can be used in some embodiments.

In some embodiments, due to the highly localized nature of the symbols in time, the receiver can be powered down during inter-arrival times of the RF pulses and predictively turned on when a pulse is expected. The RX enable signal (also referred to herein as $EN_{rec}$) illustrated in FIG. 2 can be used to control power on one or more portions of the receiver so that the RF pulses can be received in some embodiments. As shown in FIG. 2, this signal can have a pulse width of 30 ns and a period of 1 μs.

Figure 3:
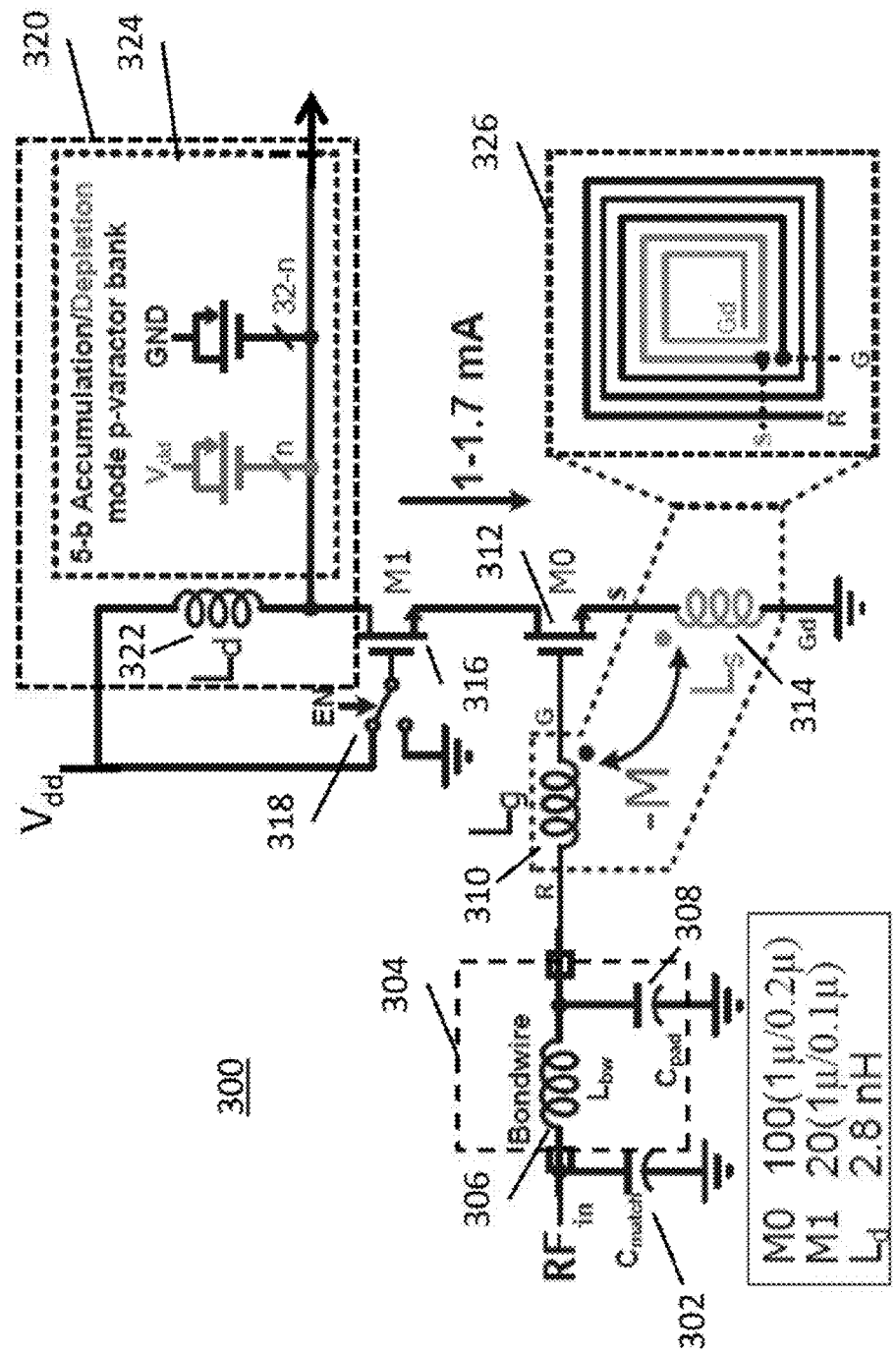
FIG. 3 is a schematic of an example of a low noise amplifier that can be used in a receiver in accordance with some embodiments.

Referring to FIG. 3, an example of an LNA 300 that can be used as LNA 110 in accordance with some embodiments is shown. As illustrated, LNA 300 can be implemented as an improved source-degenerated (SD) LNA and can include a matching capacitor 302, a π-matching network 304 having a bondwire (Lbw) 306 and a pad capacitance (Cpad) 308 (which can be implemented to operate across the lower UWB band (3.6-5 GHz)), a gate inductance 310, a first transistor 312, a source inductance 314, a second transistor 316, a switch 318, and an LC tank 320.

Figure 4:
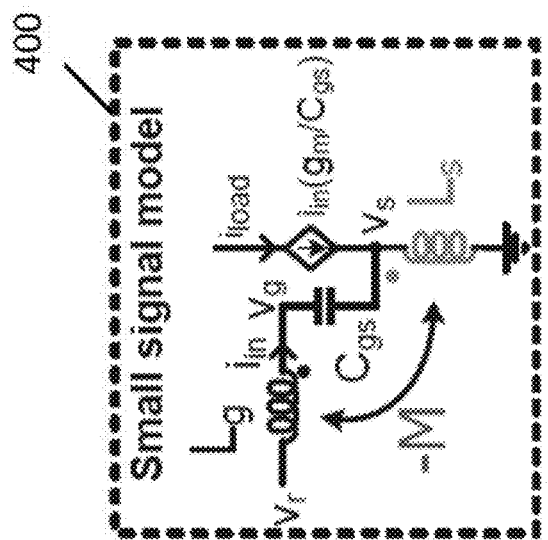
FIG. 4 is an example of a small-signal model of an SD-LNA utilizing mutual inductance that can be used to calculate its input impedance in accordance with some embodiments.

In some embodiments, as shown by merged coil 326, mutual inductance can be exploited by merging the source coil of source inductance 314 and the gate coil of gate inductance 310 into a single physical space. FIG. 4 shows an example 400 of a small-signal model of an SD-LNA utilizing mutual inductance that can be used to calculate its input impedance. The small-signal input impedance presented by the modified source degenerated LNA (at node R in FIG. 3) can be derived as follows. If $i_{in}$ represents the current drawn by the LNA and $v_g$ represents the gate voltage, the source voltage $v_s$ and the transistor current $i_{load}$ can be written as:

$$v_s = v_g - \frac{i_{in}}{sC_{gs}}$$

$$i_{load} = i_{in}\frac{g_m}{C_{gs}}.$$

Using the I-V relations of coupled inductors and eliminating $v_g$, the input impedance presented by the LNA can be obtained as follows:

$$\begin{pmatrix} v_g - v_r \\ v_g - \frac{i_{in}}{sC_{gs}} \end{pmatrix} = \begin{pmatrix} sL_g & -sM \\ -sM & sL_s \end{pmatrix} \begin{pmatrix} -i_{in} \\ i_{in}\left(1 + \frac{g_m}{sC_{gs}}\right) \end{pmatrix} \quad (1)$$

$$\Rightarrow v_r - \frac{i_{in}}{sC_{gs}} = i_{in}\left(s(M + L_g) + s(M + L_s)\left(1 + \frac{g_m}{sC_{gs}}\right)\right) \quad (2)$$

$$\Rightarrow Z_{in} = s(L_g + L_s + 2M) + \frac{1}{sC_{gs}} + \frac{g_m(L_s + M)}{C_{gs}} \quad (3)$$

The total of the gate inductance, the source inductance, and their coupling (Lg+Ls+2M) in equation (3) can be realized with an equivalent, single five-turn, square spiral inductor. The outer three turns (the larger half) of the spiral can be used to realize the gate inductance, while the inner two turns of the spiral can be used to realize the source inductance. It can be understood that if $C_{gs} \rightarrow \infty$, the node G is AC shorted to S and the impedance between R and ground (Gd), ZRGd,∞→s(Lg+Ls+2M), which is the input impedance of the equivalent five turn inductor. Since the inductance seen from the source is the combination of the inner two turns and the mutual inductance, they both contribute to the real part of the input impedance.

Any suitable LC tank can be used for LC tank 320 in some embodiments. For example, in some embodiments, tank 320 can include drain inductance 322 and an accumulation/depletion varactor bank 324. The load formed by tank 320 is tunable by configuring varactor bank 324 to have a desired capacitance. In some embodiments, a capacitor bank can be used in addition to or as an alternative to varactor bank 324.

Cascode configured transistor 316 and switch 314 can be used to power-down the LNA between RF pulses and power-up the LNA when an RF pulse may be sent under the control of an RX Enable (EN) signal.

In some embodiments, in order to achieve a suitable conversion gain in self-mixer 116, the total gain from LNA 110, RF amplifier 112, and RF amplifier 114 may need to be greater than 50 dB. Two examples of RF amplifiers suitable for use as RF amplifiers 112 and 114 in some embodiments are described below.

As shown in FIG. 3 and FIGS. 6, 7, 9, 10, and 11 (described below), examples of component specifications for the circuits are provided in a legend in the figures. Additionally or alternatively to the example values shown, any other suitable values can be used in some embodiments. For the transistors, the values are shown in the following format X(Yμ/Zμ), where X represents the number of copies of a parallel transistor implemented in silicon, Y represents the length in microns of each parallel transistor, and Z represents the width in microns of each parallel transistor.

Figure 5:
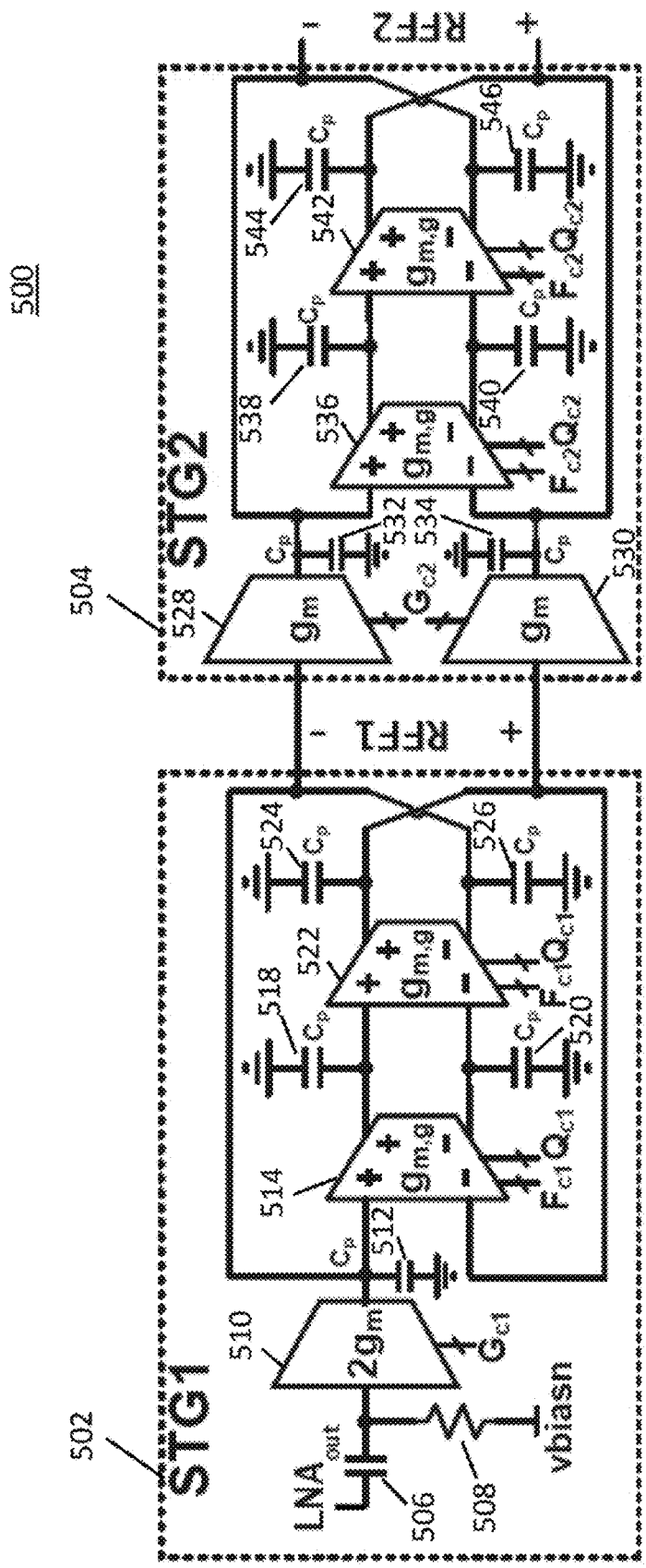
FIG. 5 is an example of two RF amplifier stages that can be used in accordance with some embodiments.

FIG. 5 illustrates a first example 500 of RF amplifiers that can be used as amplifiers 112 and 114 in some embodiments. As shown, RF amplifier 112 can be implemented using RF amplifier STG1 502 and RF amplifier 114 can be implemented using RF amplifier STG2 504.

As illustrated in FIG. 5, STG1 502 includes a dc blocking capacitor 506, a bias resistor 508, a signal transconductor 510, capacitors 512, 518, 520, 524, and 526, and gyrator transconductors 514 and 522. STG2 504 includes signal transconductors 528 and 530, capacitors 532, 534, 538, 540, 544, and 546, and gyrator transconductors 536 and 542. In the example of FIG. 5, each transconductor and the capacitor(s) connected to its output(s) form a filter having a center frequency in the 3-5 GHz range.

Figure 6:
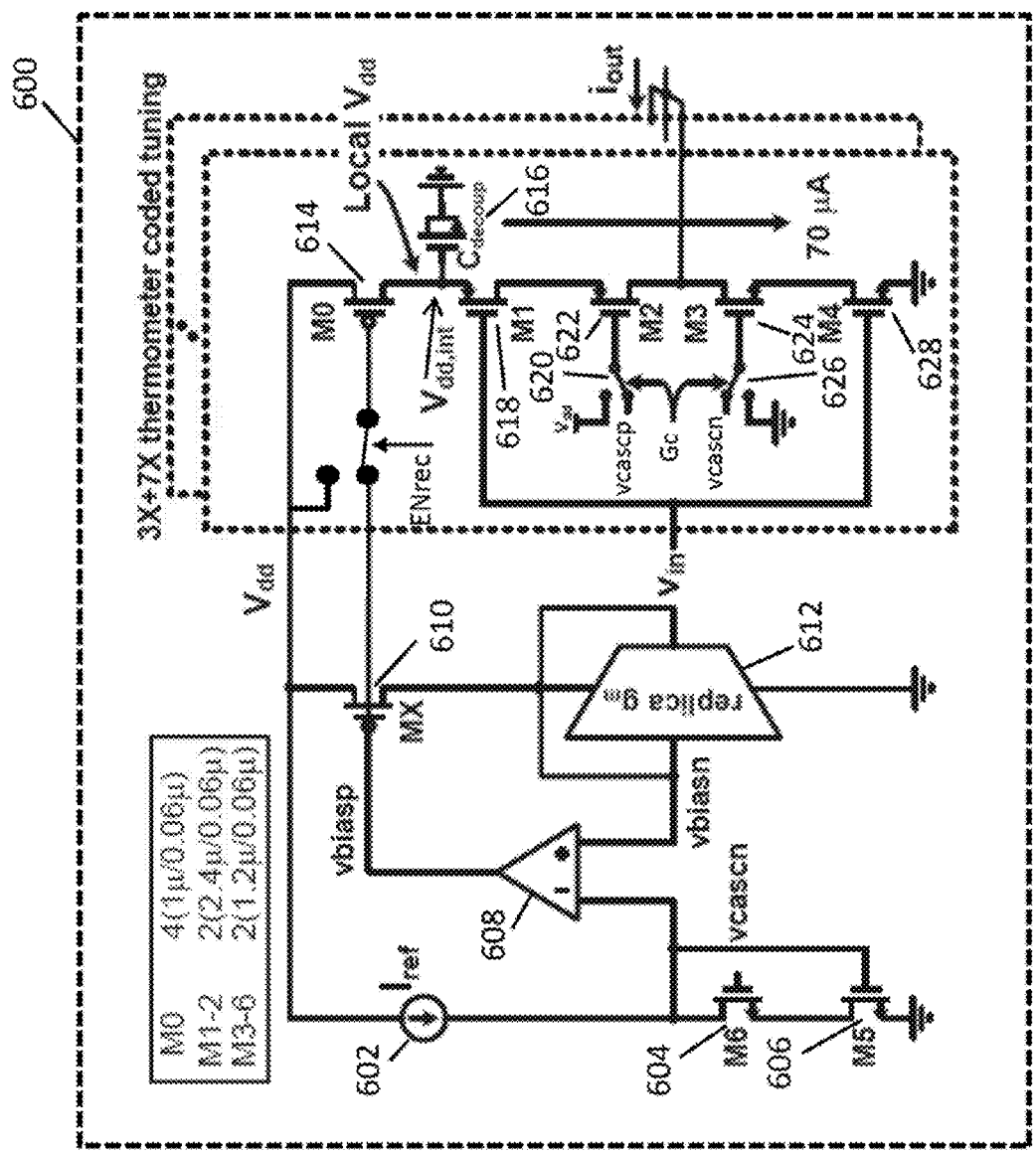
FIG. 6 is an example of a circuit for a signal transconductor that can be used in accordance with some embodiments.

Turning to FIG. 6, an example of a circuit 600 that can be used to implement signal transconductors 510, 528, and 530 of FIG. 5 is shown. As illustrated, circuit 600 includes a current source 602, transistors 604, 606, 610, 614, 618, 622, and 628, a replica transconductor 612, a decoupling capacitor 616, and switches 620 and 626.

When implemented using example circuit 600, each signal transconductor is implemented as a pseudo-differential cascoded (transistor M3 624 and transistor M2 622) common-source stage (transistor M4 628 and transistor M1 618) with current re-use. In such transconductors, transistor M0 614 (operating at the edge of saturation) is used to regulate the DC current in the transconductors via replica transconductor 612 to reduce sensitivity to the supply and process variations. Decoupling capacitor Cdecoup 616 is used to bypass transistor M0 614 for signal frequencies. This ensures that the node labeled Vdd,int in circuit 600 behaves as a local, regulated Vdd for each of the transconductors. The gain of each stage is made tunable with a three-bit control by placing multiple such transconductors in parallel.

vcascn and vcascp are bias voltages and can be provided from any suitable source.

Figure 7:
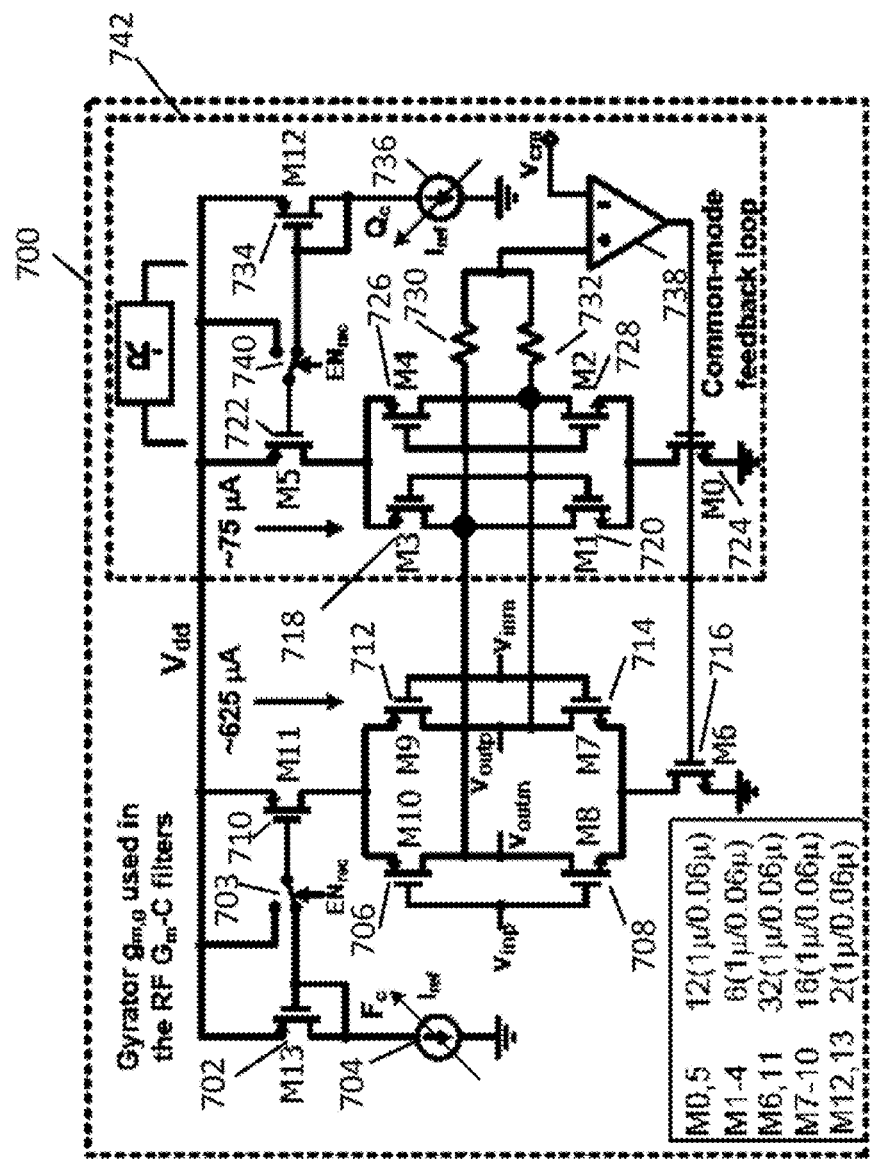
FIG. 7 is an example of a circuit for a gyrator transconductor that can be used in accordance with some embodiments.

Referring to FIG. 7, an example of a circuit 700 that can be used to implement gyrator transconductors 514, 522, 536, and 542 of FIG. 5 is shown. As illustrated, circuit 700 includes transistors 702, 706, 708, 710, 712, 714, 716, 718, 720, 722, 724, 726, 728, and 734, variable current sources 704 and 736, switches 703 and 740, resistors 730 and 732, and a comparator 738. Transistors 718, 720, 722, 724, 726, 728, and 734, variable current source 736, switch 740, resistors 730 and 732, and comparator 738 together form a negative resistance circuit 742. This negative resistance can be tuned using variable current source 736 to adjust the quality factor of the filter formed by the gyrator transconductor of which it is part and the capacitors at the output of this gyrator transconductor. The parasitic capacitances from the transistors and routing parasitics together form the capacitances of the gyrator transconductor. The frequency and the quality factor of the two stages can be individually varied through the bias current in the corresponding differential pairs using digital control bits connect to the variable current sources.

Figure 8:
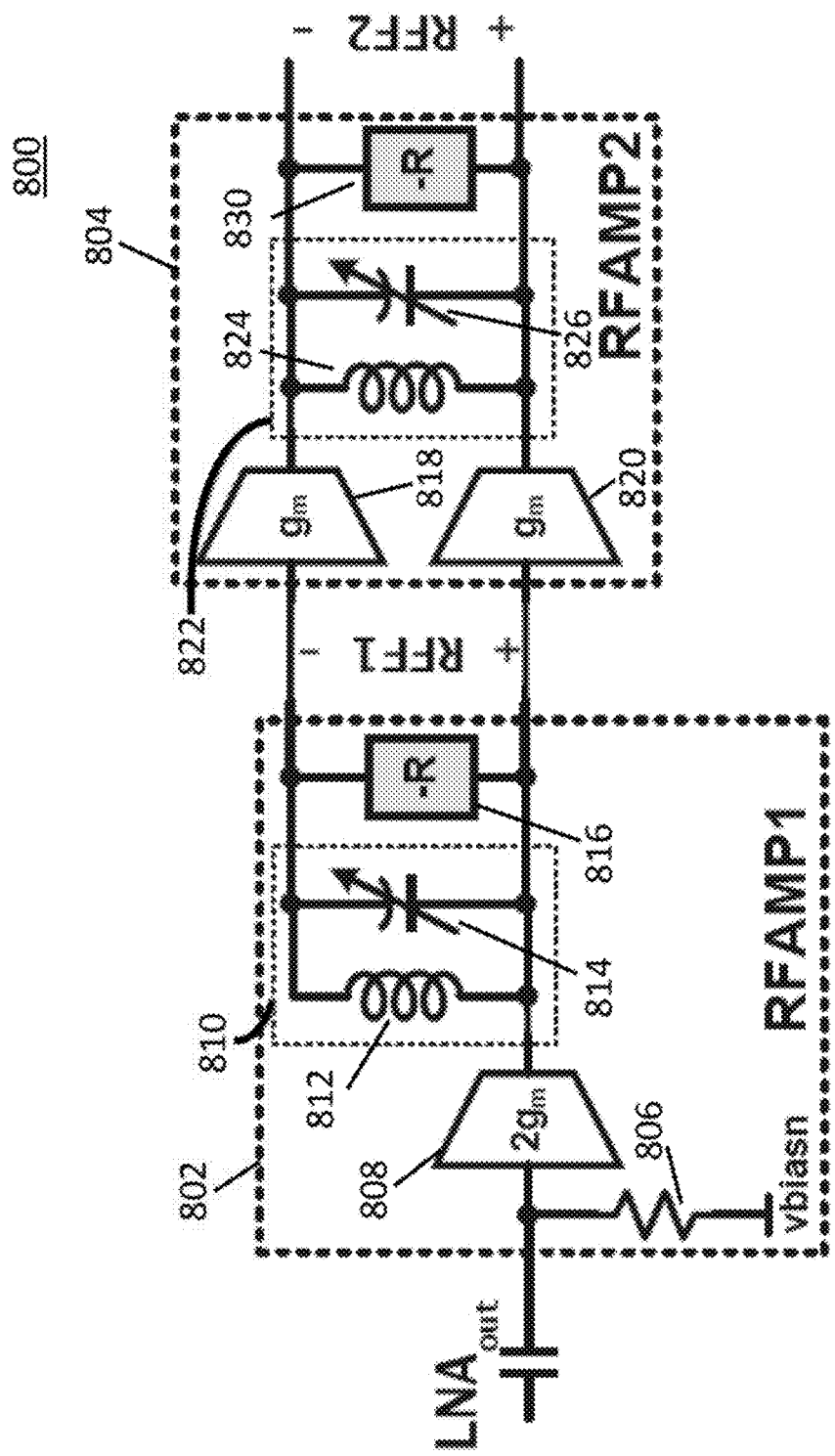
FIG. 8 is another example of two RF amplifier stages that can be used in accordance with some embodiments.
Figure 9:
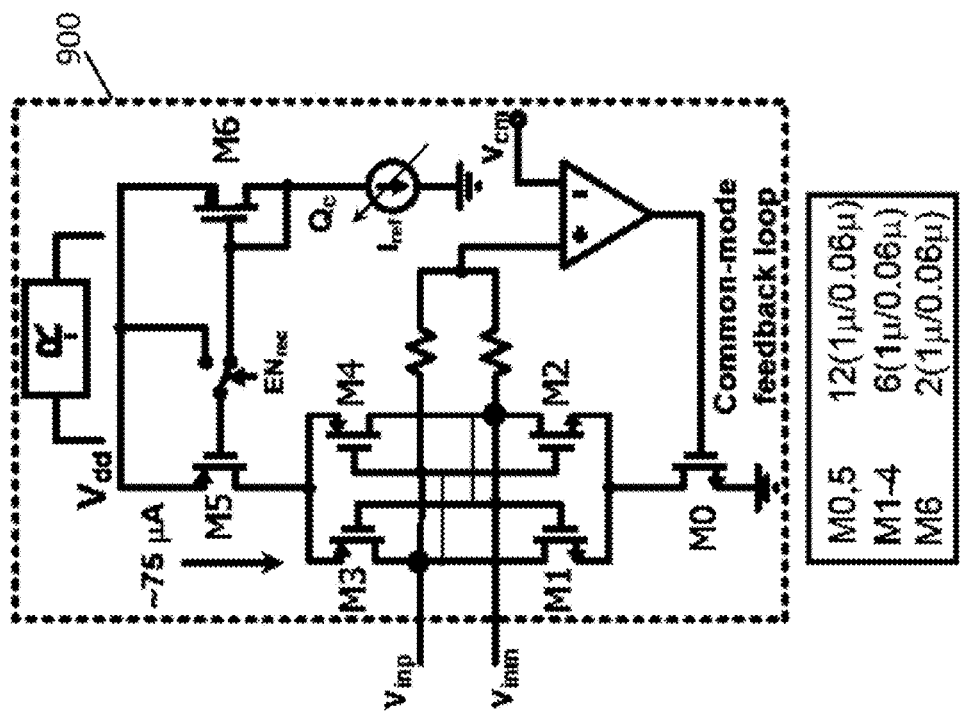
FIG. 9 is an example of a circuit for a negative resistance that can be used in accordance with some embodiments.

FIG. 8 illustrates a second example 800 of RF amplifiers that can be used as amplifiers 112 and 114 in some embodiments. As shown, RF amplifier 112 can be implemented using RF amplifier RFAMP1 802 and RF amplifier 114 can be implemented using RF amplifier RFAMP2 804. As illustrated in FIG. 5, RFAMP1 802 includes a bias resistor 806, a signal transconductor 808, an LC tank 810 formed from inductor 812 and variable capacitor 814, and a negative resistance 816. RFAMP2 804 includes signal transconductors 818 and 820, an LC tank 822 formed from inductor 824 and variable capacitor 826, and a negative resistance 830.

In some embodiments, signal transconductors 808, 818, and 820 can be implemented using circuit 600 as described above in connection with FIG. 6. In some embodiments, LC tanks 810 and 822 can be identical, or have identical or nearly identical inductances and capacitances, to LC tank 320 used in LNA 300 of FIG. 3. Negative resistance 830 can be implemented using negative resistance 900 of FIG. 9, which is similar to negative resistance 742 of FIG. 7.

Figure 10:
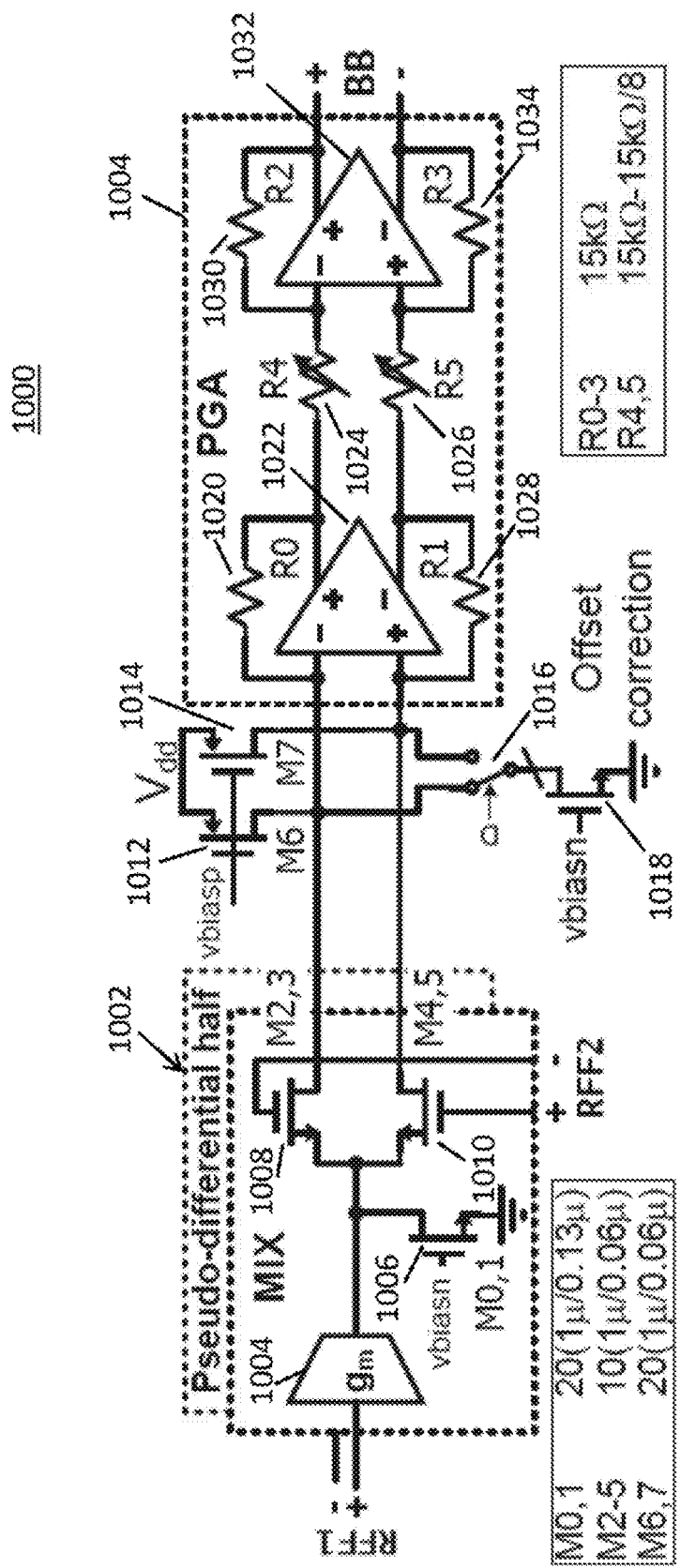
FIG. 10 is an example of a circuit for a mixer and a programmable gain amplifier that can be used in accordance with some embodiments.

FIG. 10 illustrates an example of a circuit 1000 containing a mixer 1002 and a programmable gain amplifier (PGA) 1004 that can be used for self-mixer 116 and PGA 118 of FIG. 1 in accordance with some embodiments. As shown, mixer 1002 includes a signal transconductor 1004 and transistor 1006, 1008, and 1010. Transistor 1004 can be identical (or nearly identical) to the signal transconductor used in first RF amplifier 112. The PGA includes operational transconductance amplifiers 1022 and 1032, fixed resistors 1020, 1028, 1030, and 1034, and variable resistors 1024 and 1026.

Circuit 1000 can also include an offset correction circuit between the output of mixer 1002 and the input of PGA 1004. This circuit can include transistors 1012, 1014, and 1018 and switch 1016. Under the control of a multi-bit digital signal D, multiple switches making up switch 1016 can change the current pumped in to the PGA and thus act as an offset correction circuit.

As shown in FIG. 10, the output of second RF amplifier 114 (RFF2) is connected to the switching port of mixer 1002 and the output of first RF amplifier 112 (RFF1) is connected to the linear port of mixer 1002. This technique of mixing across two RF stages contributes to interference rejection in the down-conversion process. In this mixing technique, the two signals being mixed bear a frequency dependent phase relationship set by the transfer function of second RF amplifier 114. Because second RF amplifier 114 is a 2nd order band-pass transfer function, at the center frequency (fc) of the band-pass load, the two signals being mixed have no phase shift ($\Delta\phi=0$) between them. This gradually changes to a phase shift $\Delta\phi=\pi/2$ at large frequency offsets ($|f-fc|>fc/2Q$) from the center frequency. This phase shift between the signals being mixed translates to an interference rejection ($1/\cos(\Delta\phi)$) upon mixing for frequencies at large frequency offsets in the baseband output.

The operation of the mixer is as follows: The voltage at the output of first RF amplifier 112 is converted into a current by signal transconductor 1004. The AC current generated by this transconductor is added to a DC bias current (transistor M0 1006 (and transistor M1, not shown)) before being fed into the "switching" differential pair (transistor M2 1008 (and transistor M3, not shown) and transistor M4 1010 (and transistor M5, not shown)). The switching pair is controlled by the output of second RF amplifier 114.

The output baseband current generated by the mixer is then converted to voltage by a trans-impedance amplifier (TIA) (formed from resistors 1020 and 1028 and operational transconductance amplifier 1022) and a tunable operational transconductance amplifier-resistance (OTA-R) amplifier (PGA) (formed from operational transconductance amplifier 1032, fixed resistors 1030 and 1034, and variable resistors 1024 and 1026). Variable resistors 1024 and 1026 can be digitally tunable in some embodiments.

Figure 11:
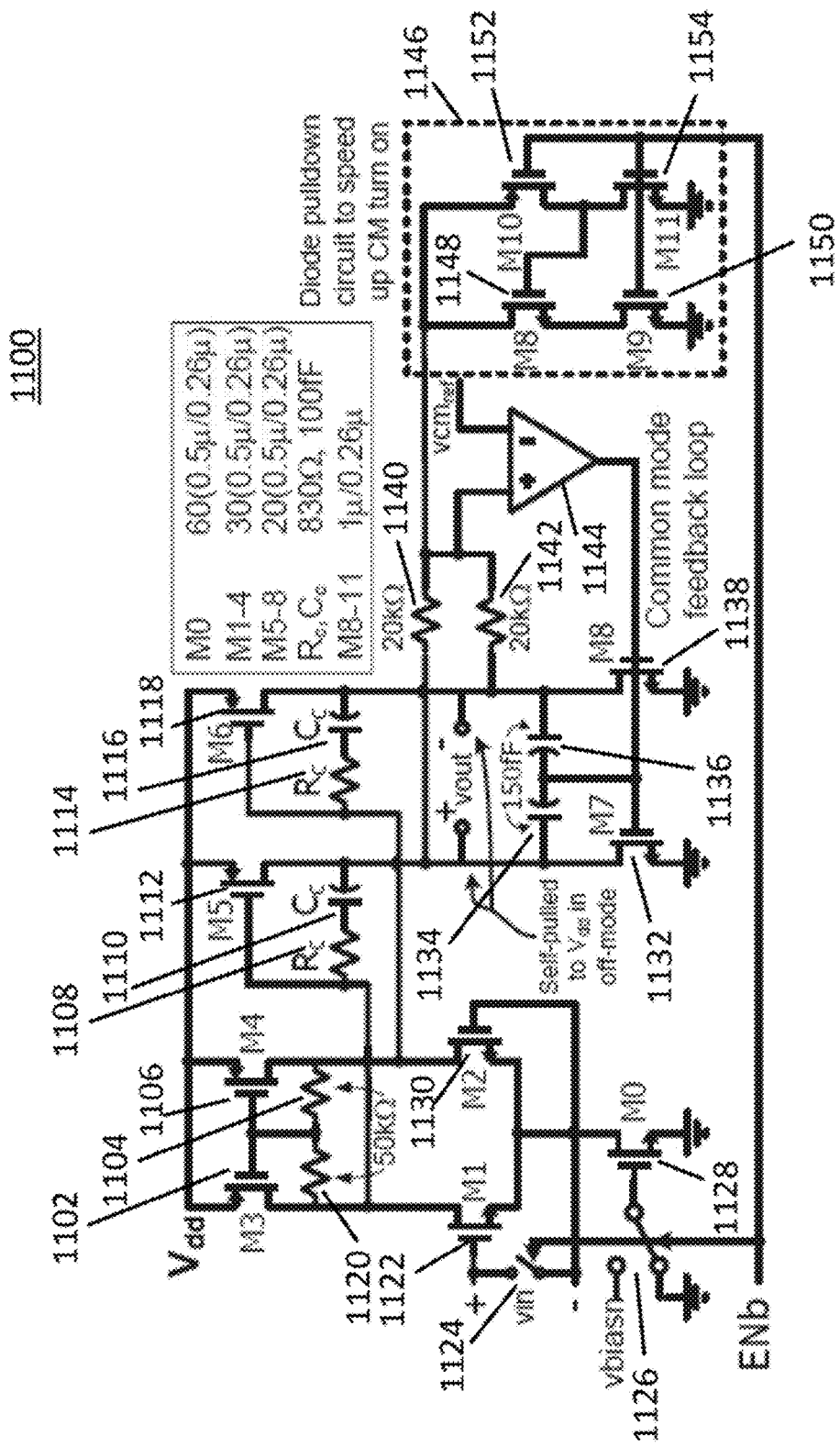
FIG. 11 is a more detailed example of a circuit for a programmable gain amplifier that can be used in accordance with some embodiments.

FIG. 11 shows an example of a PGA 1100 that can be used to implement PGA 1004 in accordance with some embodiments. As illustrated, PGA 1100 includes transistor 1102, 1106, 1122, 1130, 1128, 1112, 1132, 1118, 1138, 1148, 1150, 1152, and 1154, switches 1124 and 1126, resistors 1120, 1104, 1108, 1114, 1140, and 1142, capacitors 1110, 1116, 1134, and 1136, and comparator 1144.

As illustrated, PGA 1100 includes a diode pull down circuit 1146 formed from transistors 1148, 1150, 1152, and 1154, which operates to speed up the power on of the common mode of the OTAs, hence that of the OTAs and the power on of the overall receiver.

The output of the PGA (BB) is then fed into demodulator 120 (FIG. 1) for threshold recovery and subsequent digitization.

Figure 12:
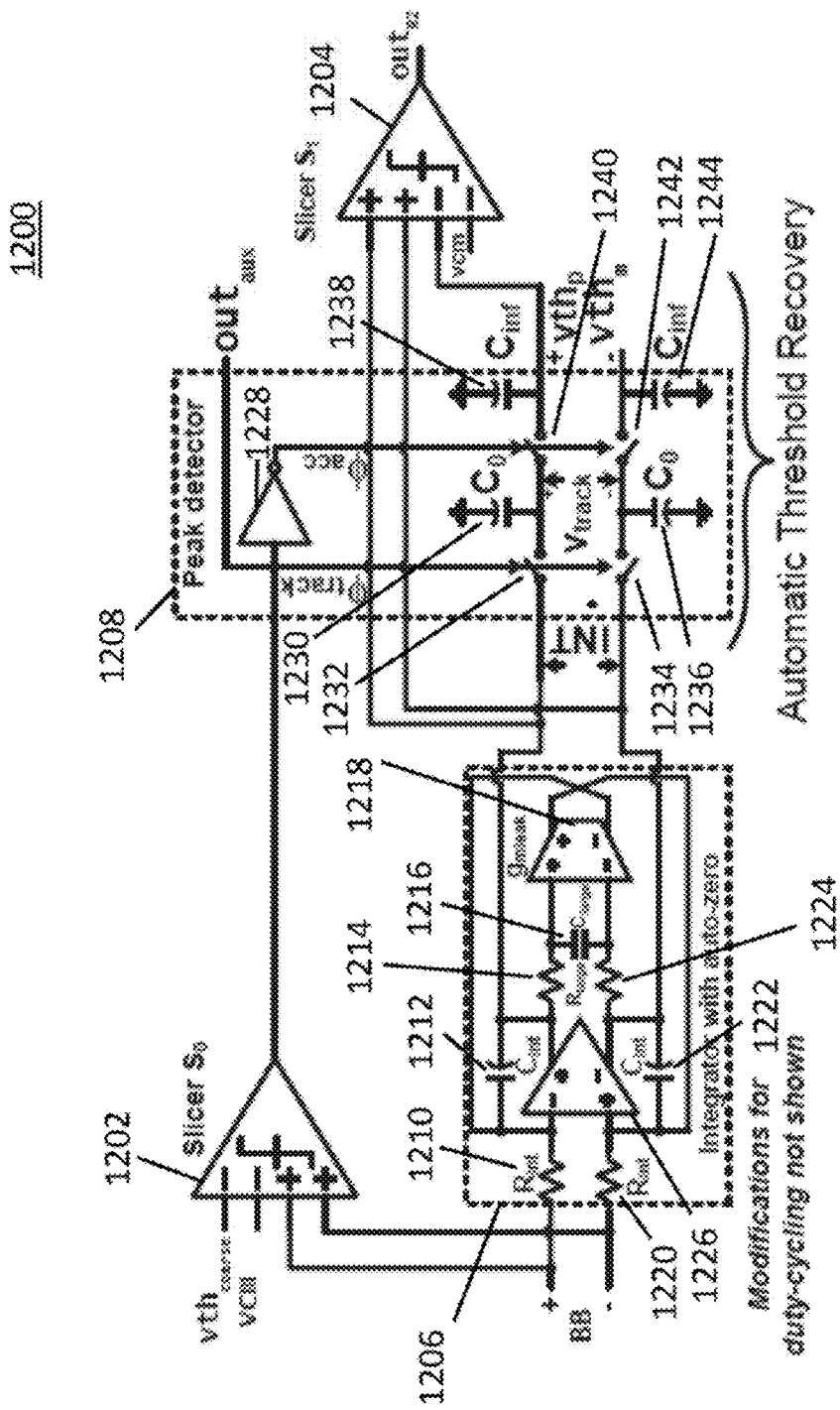
FIG. 12 is an example of a circuit that can be used for a demodulator in accordance with some embodiments.

Turning to FIG. 12, an example of a demodulator 1200 that can be used for demodulator 120 of FIG. 1 in accordance with some embodiments is shown. As illustrated, demodulator 1200 includes slicers 1202 and 1204, resistors 1210, 1220, 1214, and 1224, operational transconductance amplifiers (OTAs) 1226 and 1228, capacitors 1212, 1222, 1216, 1230, 1236, 1238, 1244, inverter 1228, and switches 1232, 1234, 1240, and 1242.

Resistors 1210, 1220, 1214, and 1224, OTAs 1226 and 1228, and capacitors 1212, 1222, and 1216 form a continuous time (CT) integrator with an auto-zero loop 1206. Capacitors 1230, 1236, 1238, 1244, inverter 1228, and switches 1232, 1234, 1240, and 1242 form an automatic threshold recovery (peak detector) circuit 1208.

Using circuit 1200, digitization of a baseband signal can be performed as follows. In a parallel path to the CT integrator, the signal from the PGA is compared by slicer 1202 with a coarse threshold voltage $vth_{coarse}$ (which can be from a digitally adjustable source in some embodiments) to produce a digital signal $out_{aux}$ that represents the presence of a pulse in the channel when high. In some embodiments, slicer 1202 can be implemented as a continuous time differential difference comparator using a cascade of gain stages and inverters.

In some embodiments, the bit error ration (BER) can be adjusted by adjusting the threshold voltage labeled $vth_{coarse}$. However, it can be seen that the BER achieved using this method may be sensitive to the specific value of $vth_{coarse}$ set by the user and the received signal power. To address this, in some embodiments, threshold recovery can be performed using automatic threshold recovery circuit 1208 as follows. The output of the CT integrator is tracked on capacitors $C_O$ 1230 and 1236 using switches 1232 and 1234 gated by $out_{aux}$. Because $out_{aux}$ represents the duration of the pulse in the channel, the voltage sampled onto capacitors $C_O$ 1230 and 1236 is the peak of the integrator's output. $out_{aux}$ behaves like the integrator gating signal in a matched filtering approach. The voltage sampled on the capacitors is the integral of the received baseband pulse and therefore represents the symbol point in a constellation diagram of the receiver's output. The value sampled on capacitors $C_O$ 1230 and 1236 is accumulated on another pair of capacitors $C_{inf}$ 1238 and 1244 during the hold phase (i.e., when $out_{aux}$ is low) through switches 1240 and 1242 as controlled by the output of inverter 1228. The voltage accumulated on capacitors $C_{inf}$ over multiple symbols gives the noise averaged signal strength for the '1' symbol. The output of the integrator is then sliced at half of this recovered threshold (differentially, vthp and the common mode voltage, vcm are used) using slicer 1204 (which can be implemented as a continuous time differential difference comparator using a cascade of gain stages). The demodulator outputs two digital RZ signals $out_{RZ}$ and $out_{aux}$ which can be used to recover the transmitted clock and convert the data into an NRZ stream.

Figure 13:
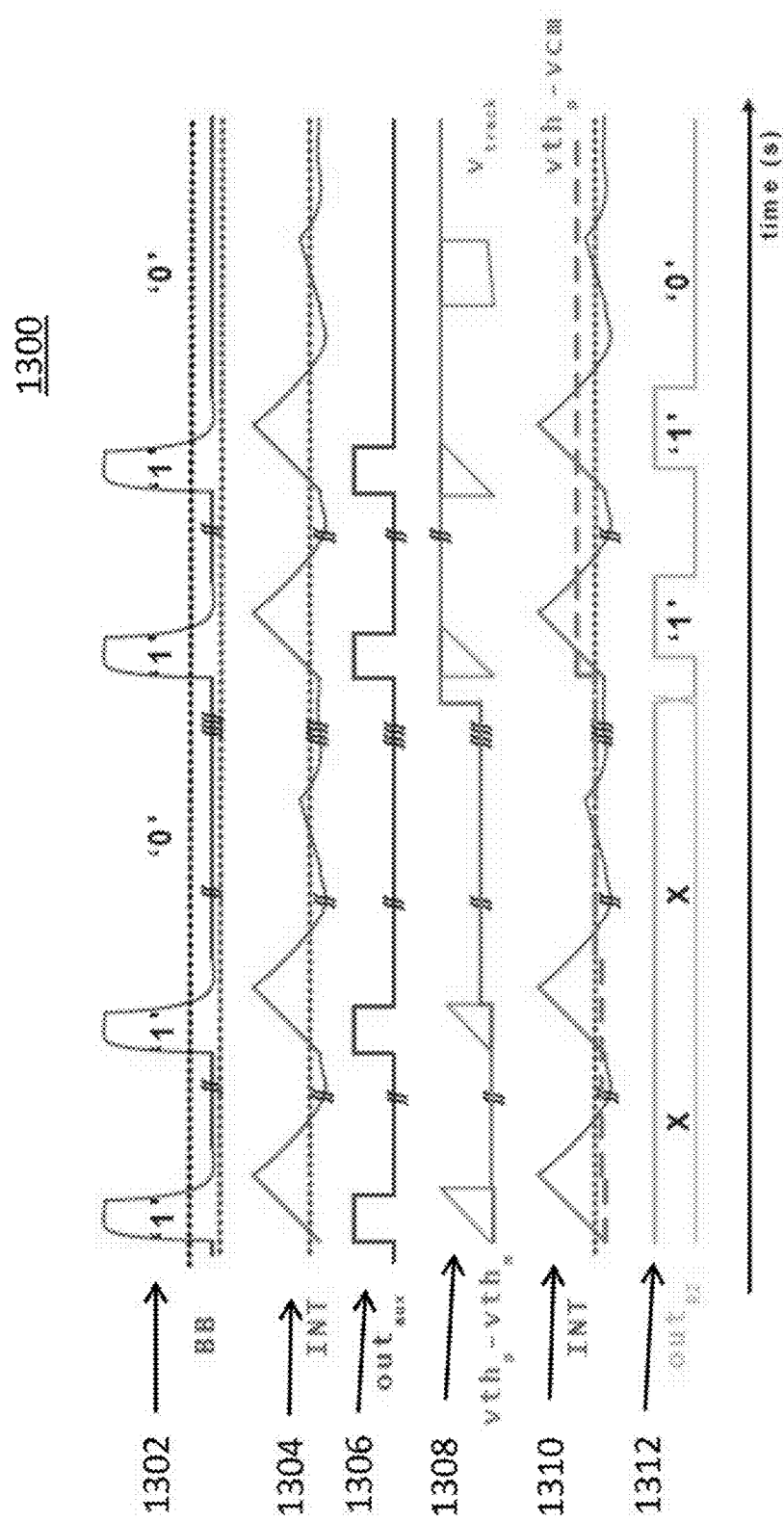
FIG. 13 is an illustration of waveforms that can be present in the demodulator of FIG. 12 in accordance with some embodiments.
Figure 14:
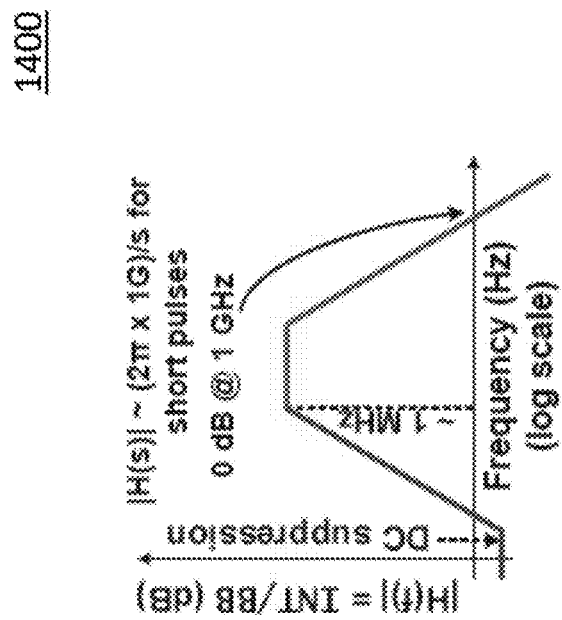
FIG. 14 is an illustration of a transfer function performed by a demodulator in accordance with some embodiments.

FIG. 13 illustrates an example 1300 of signals that may be present in receiver 100 in accordance with some embodiments. As shown, a baseband analog signal BB 1302 may be output by the PGA. Signal 1302 may then be received by the CT integrator. For high signal input frequencies (>>a 1 MHz cutoff frequency), the CT integrator can behave as an integrator with a unity gain frequency close to 1 GHz, providing a gain of ≈10 dB for a 3 ns pulse. For input signals with low frequencies (<<a 1 MHz cutoff frequency), the CT integrator can behave as a DC amplifier with an attenuating transfer function which suppresses any DC content in the baseband signal. An example illustration 1400 of the function performed by the CT integrator is shown in FIG. 14. Although a cutoff frequency of 1 MHz is described herein, any suitable cutoff frequency can be used in some embodiments. This enables the output of the integrator to leak away in between symbols and "resets" the integrator. This produces the waveform (INT) 1304. Also in response to signal BB 1302, Slicer 1202 can output signal $out_{aux}$ 1306. Using signals INT 1304 and $out_{aux}$ 1306, the automatic threshold recovery circuit can produce a differential signal $vth_p$ and $vth_n$ 1308. Signals INT 1304 and $vth_p$ and $vth_n$ 1308 can be seen by slicer 1204 as shown in 1310 and the slicer can then output signal $out_{RZ}$ 1312.

Figure 15:
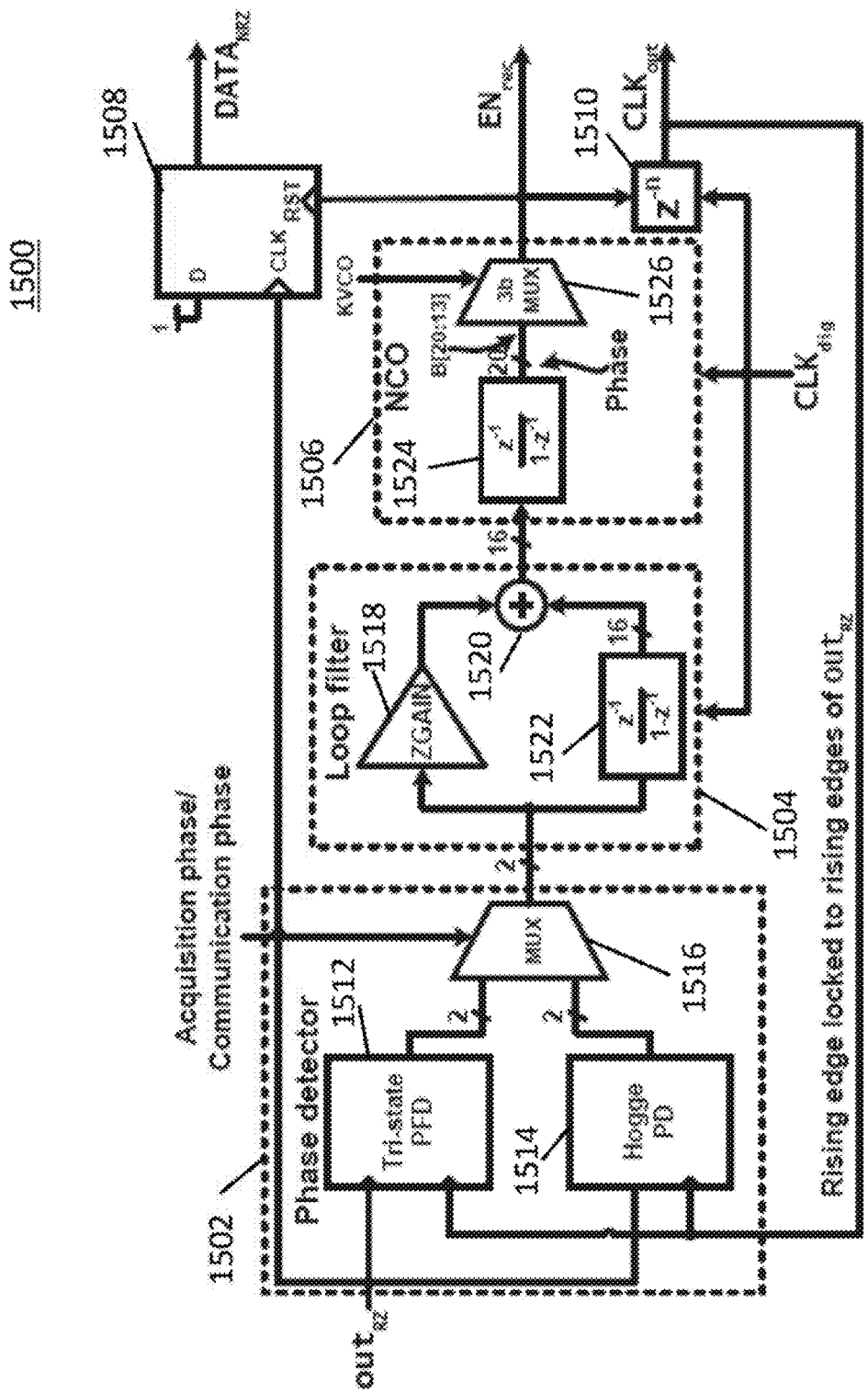
FIG. 15 is an example of a circuit for an all-digital clock and data recovery (AD-CDR) circuit that can be used in accordance with some embodiments.

Turning to FIG. 15, an example of an all-digital clock and data recovery circuit (AD-CDR) 1500 that can be used as AD-CDR 126 of FIG. 1 in accordance with some embodiments is shown. As illustrated, AD-CDR 1500 includes a tri-state phase frequency detector 1512, a Hogge phase detector 1514, multiplexers 1516 and 1526, an amplifier 1518, dividers 1522 and 1524, adder 1520, a D-Flip-Flop 1508, and a delay element 1510. Tri-state phase frequency detector 1512, Hogge phase detector 1514, and multiplexer 1516 form a phase detector 1502. Amplifier 1518, divider 1522, and adder 1520 form a loop filter 1504. Divider 1524 and multiplexer 1526 form a numerically controlled oscillator (NCO) 1506, which can be controlled by any suitable control signal.

In some embodiments, the AD-CDR can be clocked by any suitable low-precision, low-power, fixed clock (fCLK). For example, in some embodiments, the clock can have a frequency of 100 MHz, 103 MHz, or any other suitable value.

Although the clock and data recovery circuit is described as being digital, in some embodiments, this circuit can be implemented using an analog CDR.

In the AD-CDR, the turn-ON edge from the NCO jitters over +/−10 ns (i.e., 1/fCLK) due to limit cycles when fCLK and fdata are unlocked. The timing precision of the recovered lock edge is inversely proportional to fCLK, so that the digital clock frequency would have to be increased to increase lock precision. Since clocking the digital backend with a higher frequency clock would translate to a higher power consumption in the backend and in the design of the oscillator, the clock frequency can be maximized just enough to meet the system level requirements on lock precision.

During operation of AD-CDR 1500, the AD-CDR operates in an acquisition mode and a communication mode. During the acquisition mode, such as following a cold start or when a pairing between a transmitter and a receiver is desired, a pilot pulse train of all '1's is transmitted to the receiver. The receiver is continuously on during this mode and the CDR is configured to operate with a phase-frequency detector to obtain phase and frequency lock. Once the lock is achieved, the receiver enters the communication mode during which the receiver is powered on and off. In the communication mode, the CDR maintains phase lock with the incoming stream using Hogge phase detector 1514.

More particularly, the $out_{RZ}$ pulse arrival is compared to CLKout, the output of NCO 1506 as delayed by delay element 1510, using tri-state PFD 1502 during acquisition mode and Hogge phase-detector 1514 during communication mode. The loop bandwidth can be configured to be a fraction of the RZ pilot pulse arrival rate. The AD-CDR can operate in acquisition mode for the first 32 pulses on startup. Following this, the AD-CDR acquires a frequency lock and switches to communication mode, when Hogge phase detector 1514 is used to maintain phase lock.

Multiplexer 1516 selects one of the outputs of detectors 1512 and 1514 based on the mode of the receiver and provides that output to loop filter 1504. As shown in FIG. 15, loop filter 1504 has a proportional and integral path. As shown, in the proportional path, an amplifier 1518 amplifies the output. In the integral path, an accumulator 1522 accumulates the input. An adder 1520 in the loop filter then adds the outputs of amplifier 1518 and accumulator 1522 together and provides the sum to NCO 1506.

Accumulator 1524 takes the output from the loop filter and provides that to a three bit multiplexer, which selects a certain bit of the divider output based on a signal KVCO. KVCO is a digital control that can be fed into the AD-CDR. The selected bit is then used as an enable signal $EN_{rec}$ to control the powering on and powering off of components of the receiver. The rising edge of $EN_{rec}$ is also provided as a reset signal to D-Flip-Flop 1508, after which D-Flip-Flop 1508 is reset and is set high.

Figure 16:
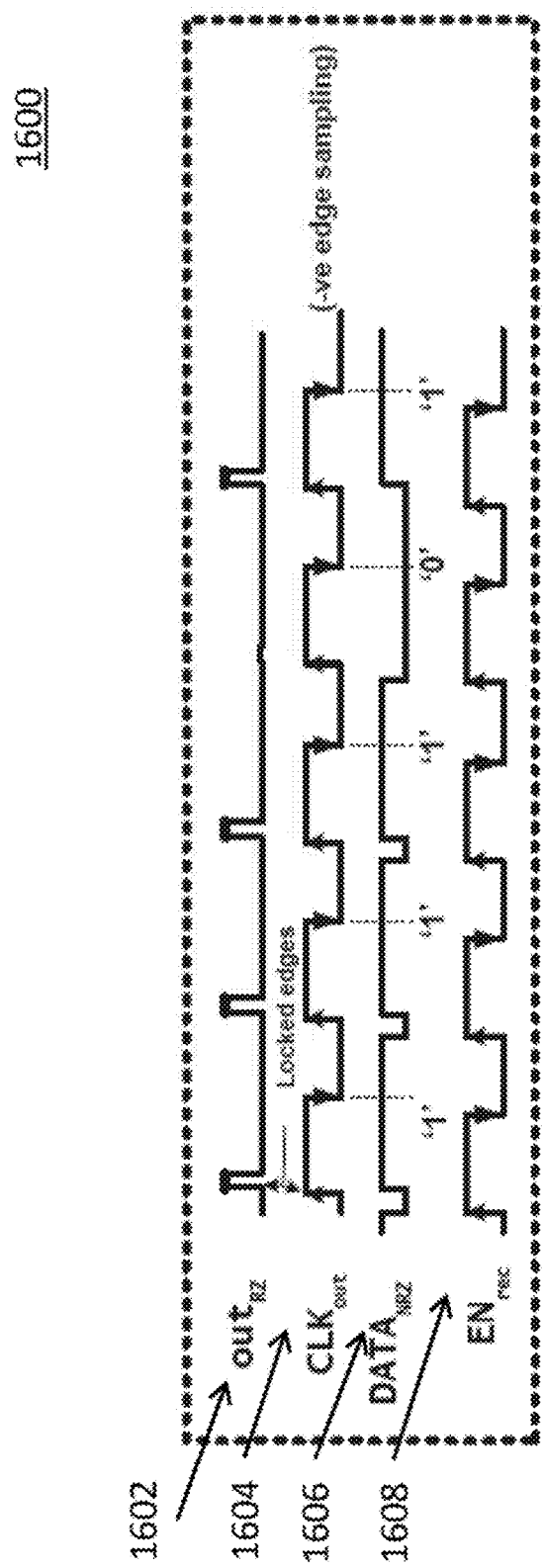
FIG. 16 is an illustration of waveforms that can be present in the AD-CDR circuit of FIG. 15 in accordance with some embodiments.

FIG. 16 is an example of an illustration 1600 of a signal $CLK_{out}$ 1604, $DATA_{NRZ}$ 1606, and $EN_{rec}$ 1608 that can be generated by AD-CDR 1500 in response to a signal $out_{RZ}$ 1602 in some embodiments.

Figure 17:
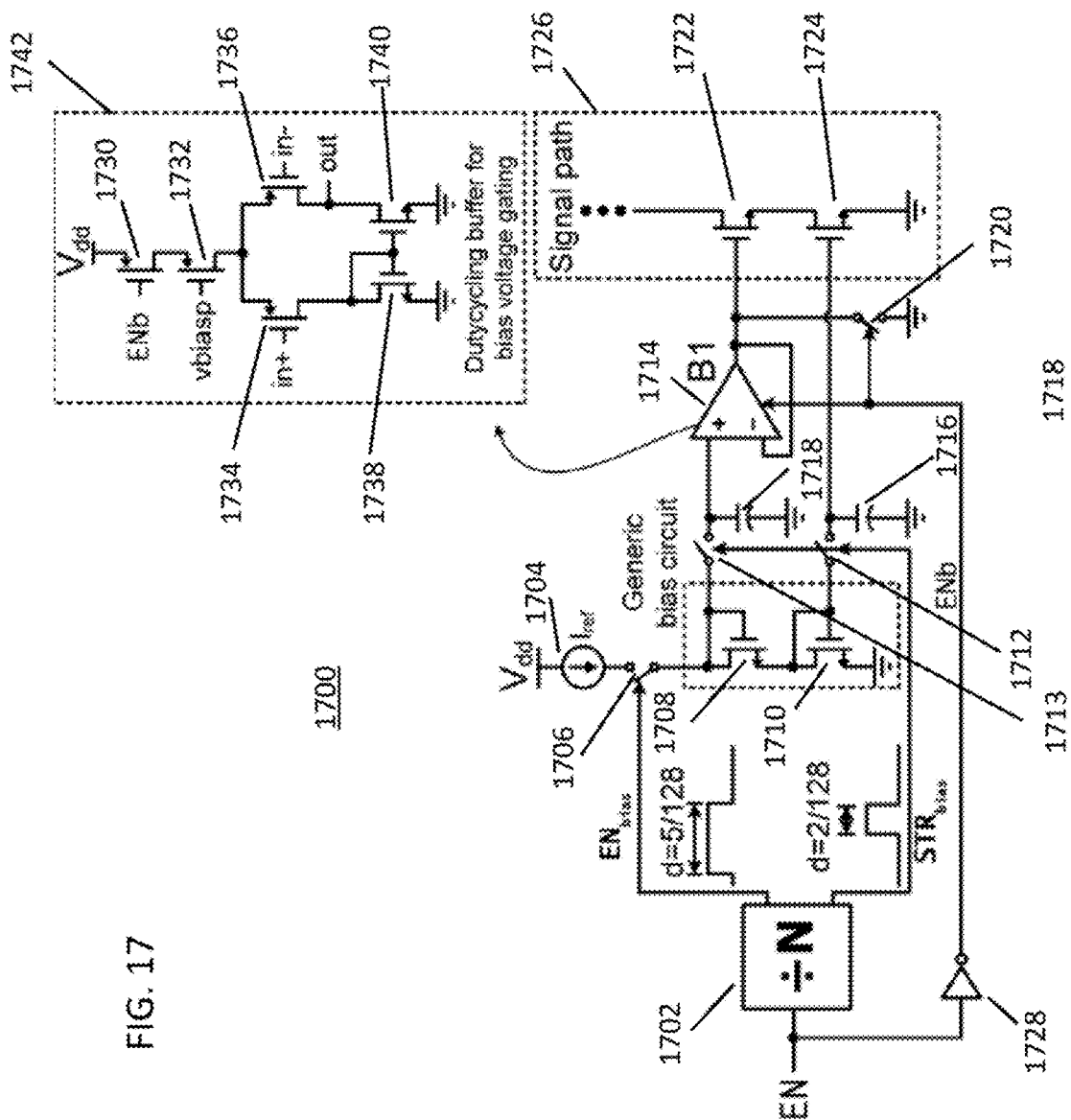
FIG. 17 is an example of a circuit that can be used for powering on and powering off, and controlling the bias of, various components of a receiver in accordance with some embodiments.
Figure 18:
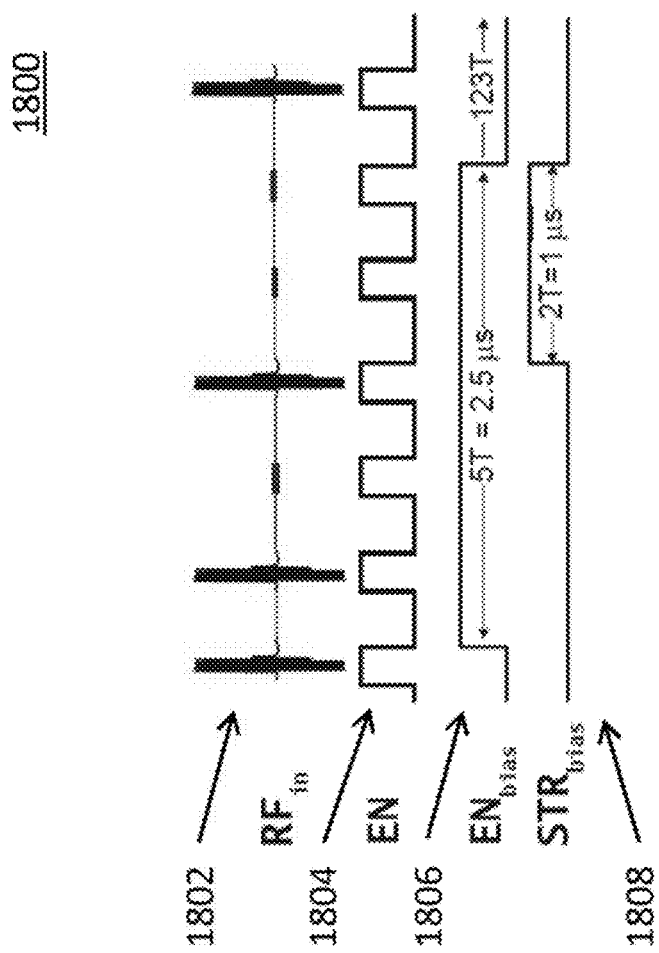
FIG. 18 is an illustration of waveforms that can be used for powering on and powering off, and controlling the bias of, various components of a receiver in accordance with some embodiments.

Turning to FIG. 17, an example of a circuit 1700 that can be used to power-on and power-off components of the receiver is shown. As illustrated, circuit 1700 includes a divider 1702, a current source 1704, switches 1706, 1712, 1713, and 1720, transistors 1708, 1710, 1722, and 1724, capacitors 1716 and 1718, operational amplifier 1714, and inverter 1728. As shown, operational amplifier 1714 can be formed from circuit 1742, including transistors 1730, 1732, 1734, 1736, 1738, and 1740, in some embodiments.

During operation, this circuit receives an enable (EN) signal, which can be $EN_{rec}$. Divider 1702 divides this signal to produce a bias duty-cycling control signal ($EN_{bias}$) and a store bias control signal ($STR_{bias}$). Bias duty-cycling control signal ($EN_{bias}$) can be used to power on the bias circuits for every five pulses out of every 128 pulses. Store bias control signal ($STR_{bias}$) can be used to control the storing of the bias signal. These signals may be generated in the manner shown by signals 1802, 1804, 1806, and 1808 in example illustration 1800 of FIG. 18. In response to EN, $EN_{bias}$ and $STR_{bias}$ via switches 1706, 1713, and 1712 and inverter 1728, current source 1704 and transistors 1708 and 1710 can be used to generate a bias voltage across capacitors 1716 and 1718, which also store the bias voltage. The bias voltage can then be provided to a transistor 1724 in a component 1726 that needs the bias voltage. Also in response to EN, $EN_{bias}$ and $STR_{bias}$ via switch 1720 and inverter 1728, operational amplifier 1714 can generate an enable signal to power on and power off component 1726 using transistor 1722.

In some embodiment, the receiver described herein can be implemented in any suitable semiconductor technology. For example, in some embodiments, the receiver can be implemented in a 65 nm LP CMOS technology.

Figure 19:
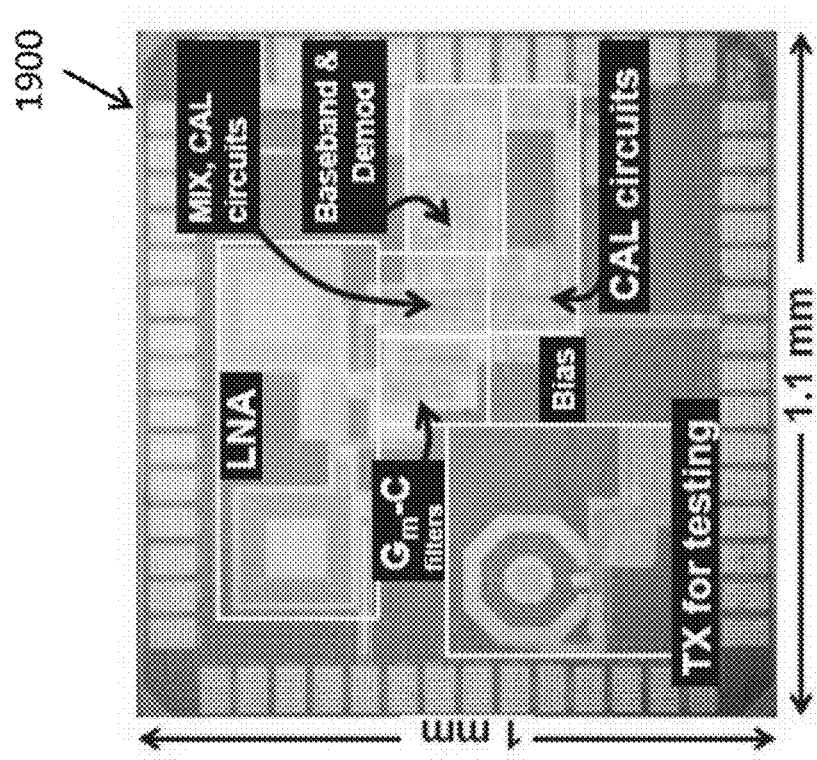
FIG. 19 is a die photograph of a receiver in accordance with some embodiments.
Figure 20:
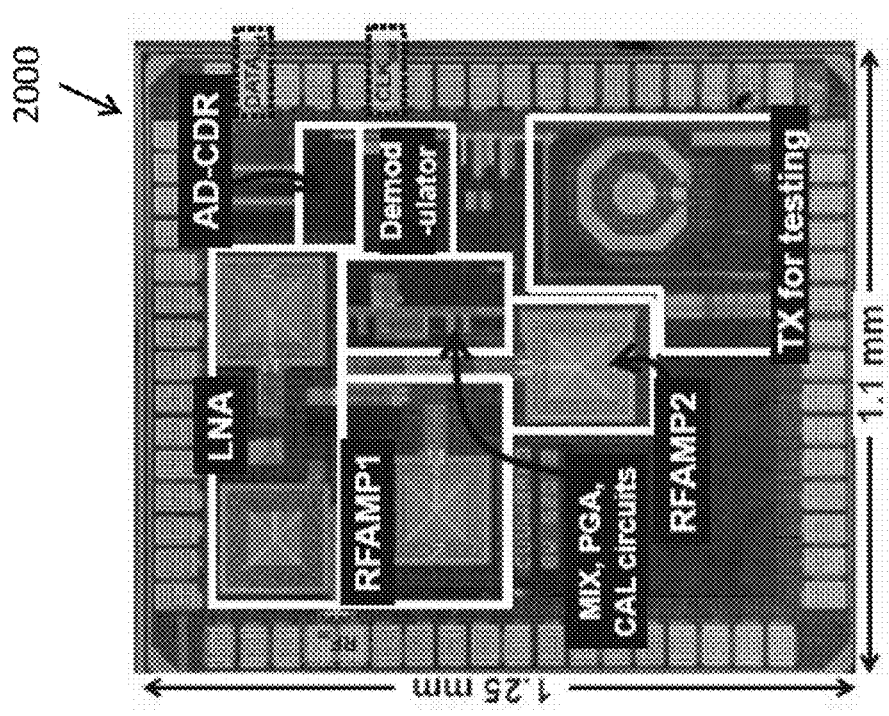
FIG. 20 is another die photograph of a receiver in accordance with some embodiments.

FIGS. 19 and 20 show examples of die photographs of two receivers (including testing circuits) with active areas of 0.4 mm$^2$ (FIG. 19) and 0.5 mm$^2$ (FIG. 20) in accordance with some embodiments.

Although the invention has been described and illustrated in the foregoing illustrative embodiments, it is understood that the present disclosure has been made only by way of example, and that numerous changes in the details of implementation of the invention can be made without departing from the spirit and scope of the invention, which is limited only by the claims which follow. Features of the disclosed embodiments can be combined and rearranged in various ways.

What is claimed is:

1. A circuit for a pulse radio receiver, comprising:
   a radio frequency amplifier that powers off in response to an enable signal;
   a demodulator that outputs an RZ signal;
   an all-digital clock and data recovery circuit comprising:
      a phase detector that includes a tri-state phase frequency detector for use when in an acquisition mode and a Hogge phase detector for use when in a communication mode, that receives the RZ signal, and that outputs a phase detector output from the tri-state phase frequency detector when in the acquisition mode and from the Hogge phase detector when in the communication mode,
      a loop filter that receives the phase detector output from the phase detector and produces a loop filter output that is the sum of a proportional path of the loop filter and an integral path of the loop filter, and
      a numerical controlled oscillator that receives the loop filter output and produces the enable signal.

2. The circuit of claim 1, further comprising a low noise amplifier, a second radio frequency amplifier, a mixer, and a programmable gain amplifier, wherein the low noise amplifier generates a first output that is amplified by the radio frequency amplifier to produce a second output, and the second radio frequency amplifier amplifies the second output to produce a third output, the mixer mixes the second output and the third output to produce a fourth output, the programmable gain amplifier amplifies the fourth output to produce a fifth output, and the demodulator receives the fifth output.

3. The circuit of claim 2, wherein the radio frequency amplifier includes:
   a signal transconductor that is coupled to the first output;
   a first gyrator transconductor that is coupled to an output of the signal transconductor; and
   a second gyrator transconductor that is coupled to an output of the first gyrator transconductor and produces a differential output as the second output.

4. The circuit of claim 3, wherein the second radio frequency amplifier includes:
   a pair of signal transconductors that receive the differential output of the radio frequency amplifier;
   a first gyrator transconductor that is coupled to outputs of the pair of signal transconductors;
   a second gyrator transconductor that is coupled to outputs from the first gyrator transconductor and that produces the third output.

5. The circuit of claim 2, wherein the radio frequency amplifier includes:
   a signal transconductor with an input that is coupled to the first output and that produces one leg of a differential output that is used as the first output;
   an LC bank coupled to an output of the signal transconductor and a second leg out the differential output; and
   a negative resistance coupled to the output of the signal transconductor and the second leg of the differential output.

6. The circuit of claim 2, wherein the second radio frequency amplifier includes:
   a pair of signal transconductors coupled to the differential output of the radio frequency amplifier that each has an output that is one leg of a differential output that is the third output;
   an LC bank coupled to the outputs of the pair of signal transconductors; and
   a negative resistance coupled to the outputs of the pair of signal transconductors.

7. The circuit of claim 2, wherein the demodulator includes:
- a first slicer that compares the fifth output to a coarse threshold to produce a track output;
- an integrator coupled to the fifth output that produces an integrator output;
- a peak detector that receives the track output and the integrator output and that produces a recovered threshold; and
- a second slicer that receives the integrator output and the recovered threshold and that produces the RZ signal.

8. The circuit of claim 7, wherein the first slicer includes a differential difference comparator.

9. A method of operating a pulse radio receiver, comprising:
- powering off a radio frequency amplifier in response to an enable signal;
- outputting an RZ signal from a demodulator;
- using an all-digital clock and data recovery circuit to:
  - using a phase detector that includes a tri-state phase frequency detector for use when in an acquisition mode and a Hogge phase detector for use when in a communication mode to receive the RZ signal and output a phase detector output from the tri-state phase frequency detector when in the acquisition mode and from the Hogge phase detector when in the communication mode,
  - using a loop filter to receive the phase detector output from the phase detector and produce a loop filter output that is the sum of a proportional path of the loop filter and an integral path of the loop filter, and
  - using a numerical controlled oscillator to receive the loop filter output and produce the enable signal.

10. The method of claim 9, further comprising:
- using a low noise amplifier to generate a first output that is amplified by the radio frequency amplifier to produce a second output;
- using a second radio frequency amplifier to amplify the second output to produce a third output;
- using a mixer to mix the second output and the third output to produce a fourth output;
- using a programmable gain amplifier to amplify the fourth output to produce a fifth output; and
- using the demodulator to receive the fifth output.

11. The method of claim 10, wherein the radio frequency amplifier includes:
- a signal transconductor that is coupled to the first output;
- a first gyrator transconductor that is coupled to an output of the signal transconductor; and
- a second gyrator transconductor that is coupled to an output of the first gyrator transconductor and produces a differential output as the second output.

12. The method of claim 11, wherein the second radio frequency amplifier includes:
- a pair of signal transconductors that receive the differential output of the radio frequency amplifier;
- a first gyrator transconductor that is coupled to outputs of the pair of signal transconductors;
- a second gyrator transconductor that is coupled to outputs from the first gyrator transconductor and that produces the third output.

13. The method of claim 10, wherein the radio frequency amplifier includes:
- a signal transconductor with an input that is coupled to the first output and that produces one leg of a differential output that is used as the first output;
- an LC bank coupled to an output of the signal transconductor and a second leg out the differential output; and
- a negative resistance coupled to the output of the signal transconductor and the second leg of the differential output.

14. The method of claim 10, wherein the second radio frequency amplifier includes:
- a pair of signal transconductors coupled to the differential output of the radio frequency amplifier that each has an output that is one leg of a differential output that is the third output;
- an LC bank coupled to the outputs of the pair of signal transconductors; and
- a negative resistance coupled to the outputs of the pair of signal transconductors.

15. The method of claim 10, wherein the demodulator includes:
- a first slicer that compares the fifth output to a coarse threshold to produce a track output;
- an integrator coupled to the fifth output that produces an integrator output;
- a peak detector that receives the track output and the integrator output and that produces a recovered threshold; and
- a second slicer that receives the integrator output and the recovered threshold and that produces the RZ signal.

16. The method of claim 15, wherein the first slicer includes a differential difference comparator.

* * * * *